(12) United States Patent
Yamazaki et al.

(10) Patent No.: US 8,470,648 B2
(45) Date of Patent: Jun. 25, 2013

(54) METHOD FOR MANUFACTURING SEMICONDUCTOR DEVICE

(75) Inventors: Shunpei Yamazaki, Setagaya (JP); Hideto Ohnuma, Atsugi (JP); Tetsuya Kakehata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 278 days.

(21) Appl. No.: 12/899,993

(22) Filed: Oct. 7, 2010

(65) Prior Publication Data
US 2011/0027968 A1    Feb. 3, 2011

Related U.S. Application Data

(62) Division of application No. 12/222,917, filed on Aug. 19, 2008, now abandoned.

(30) Foreign Application Priority Data

Aug. 24, 2007    (JP) ................... 2007-218478

(51) Int. Cl.
*H01L 21/762*    (2006.01)

(52) U.S. Cl.
USPC ........... 438/149; 438/151; 438/455; 438/458; 438/514; 257/E21.567

(58) Field of Classification Search
USPC ............... 438/149–153, 455–459, 473–475, 438/514–515
See application file for complete search history.

(56) References Cited

U.S. PATENT DOCUMENTS

| 4,472,729 A | 9/1984 | Shibata et al. |
| 4,933,298 A | 6/1990 | Hasegawa |
| 5,028,976 A | 7/1991 | Ozaki et al. |
| 5,422,302 A | 6/1995 | Yonehara et al. |

(Continued)

FOREIGN PATENT DOCUMENTS

| JP | 05-090117 | 4/1993 |
| JP | 07-297377 | 11/1995 |

(Continued)

OTHER PUBLICATIONS

Jung et al., "Highly Cost Effective and High Performance 65 nm $S^3$ (Stacked Single-Crystal Si) SRAM Technology with $25F^2$, $0.16um^2$ Cell and Doubly Stacked SSTFT Cell Transistors for Ultra High Density and High Speed Applications," 2005 Symposium on VLSI Technology Digest of Technical Papers, 2005, pp. 220-221.

(Continued)

*Primary Examiner* — Thanh Nguyen
(74) *Attorney, Agent, or Firm* — Eric J. Robinson; Robinson Intellectual Property Law Office, P.C.

(57) ABSTRACT

A semiconductor device including a plurality of field-effect transistors which are stacked with a planarization layer interposed therebetween over a substrate having an insulating surface, in which semiconductor layers in the plurality of field-effect transistors are separated from semiconductor substrates, and the semiconductor layers are bonded to an insulating layer formed over the substrate having an insulating surface or an insulating layer formed over the planarization layer.

21 Claims, 22 Drawing Sheets

U.S. PATENT DOCUMENTS

| | | | |
|---|---|---|---|
| 5,643,801 A | 7/1997 | Ishihara et al. | |
| 5,877,034 A | 3/1999 | Ramm et al. | |
| 5,976,953 A | 11/1999 | Zavracky et al. | |
| 6,037,635 A | 3/2000 | Yamazaki | |
| 6,372,609 B1 | 4/2002 | Aga et al. | |
| 6,380,046 B1 | 4/2002 | Yamazaki | |
| 6,424,020 B1 | 7/2002 | Vu et al. | |
| 6,525,340 B2 | 2/2003 | Colavito et al. | |
| 6,717,180 B2 | 4/2004 | Yamazaki et al. | |
| 6,821,826 B1 | 11/2004 | Chan et al. | |
| 6,908,797 B2 | 6/2005 | Takano | |
| 7,052,974 B2 | 5/2006 | Mitani et al. | |
| 7,074,656 B2 | 7/2006 | Yeo et al. | |
| 7,105,394 B2 | 9/2006 | Hachimine et al. | |
| 7,199,024 B2 | 4/2007 | Yamazaki | |
| 7,298,009 B2 | 11/2007 | Yan et al. | |
| 7,312,487 B2 | 12/2007 | Alam et al. | |
| 7,332,384 B2 | 2/2008 | Buchholtz et al. | |
| 7,393,732 B2 | 7/2008 | Rim | |
| 8,049,253 B2 * | 11/2011 | Isobe | 257/288 |
| 2005/0260800 A1 | 11/2005 | Takano | |
| 2006/0049430 A1 | 3/2006 | Kasai et al. | |
| 2008/0283958 A1 | 11/2008 | Ohnuma | |

FOREIGN PATENT DOCUMENTS

| | | |
|---|---|---|
| JP | 10-326895 | 12/1998 |
| JP | 11-163363 | 6/1999 |
| JP | 11-163363 A | 6/1999 |
| JP | 2000-124092 | 4/2000 |
| JP | 2003-273240 | 9/2003 |
| JP | 2005-039171 | 2/2005 |

OTHER PUBLICATIONS

Hayashi et al., "A New Three Dimensional IC Fabrication Technology, Stacking Thin Film Dual-CMOS Layers," IEDM 91, 1991, pp. 657-660.

S. K. Kim et al., Low Temperature Silicon Circuit Layering for Three-Dimensional Integration, Proceedings 2004 IEEE International SOI Conference, 2004, pp. 136-138.

* cited by examiner

METHOD FOR MANUFACTURING SEMICONDUCTOR DEVICE

BACKGROUND OF THE INVENTION

1. Field of the Invention

The present invention relates to semiconductor devices having a so-called SOI (silicon on insulator) structure in which a semiconductor layer is provided on an insulating surface.

2. Description of the Related Art

As an alternative to an integrated circuit using a silicon wafer which is manufactured by thinly slicing a single crystal semiconductor ingot, an integrated circuit using a semiconductor substrate which is referred to as a silicon on insulator (hereinafter also referred to as "SOI") in which a thin single crystal semiconductor layer is provided on an insulating surface has been developed. The integrated circuit using an SOI substrate has attracted attention as an integrated circuit which reduces parasitic capacitance between a drain of a transistor and the substrate and improves performance of a semiconductor integrated circuit.

As a method for manufacturing SOI substrates, a hydrogen ion implantation separation method is known (for example, see Reference 1: Japanese Published Patent Application No. 2000-124092). A hydrogen ion implantation separation method is a method by which hydrogen ions are implanted into a silicon wafer to form a microbubble layer at a predetermined depth from the surface, and a thin silicon layer is bonded to another silicon wafer using the microbubble layer as a cleavage plane. In addition to perform heat treatment for separation of the silicon layer, it is necessary to perform heat treatment in oxidizing atmosphere in order to form an oxide film on the silicon layer and to remove the oxide film, and then to perform heat treatment at 1000 to 1300° C. to increase bonding strength.

On the other hand, a semiconductor device in which an insulating substrate such as high heat resistance glass is provided with a silicon layer is disclosed (e.g., see Reference 2: Japanese Published Patent Application No. H11-163363). This semiconductor device has a structure in which the entire surface of crystallized glass having a distortion point of 750° C. or more is protected by an insulating silicon film, and a silicon layer obtained by a hydrogen ion implantation separation method is fixed to the insulating silicon film.

SUMMARY OF THE INVENTION

Microfabrication has been a main element of a technical development road map in a field of semiconductor devices, and thus, the field of devices has been developed. So far, as the semiconductor devices are miniaturized, higher speed operation can be realized, and thus lower power consumption has been achieved.

However, there is a need for achieving higher performance and lower power consumption of semiconductor devices without depending only on a microfabrication technique.

Accordingly, it is an object to achieve higher performance and lower power consumption in semiconductor devices having an SOI structure. In addition, it is another object to provide semiconductor devices including more highly integrated and higher performance semiconductor elements.

A plurality of semiconductor elements such as field-effect transistors which include a semiconductor layer which has been separated from a semiconductor substrate and is bonded to a supporting substrate having an insulating surface are stacked with a planarization layer interposed therebetween.

A semiconductor layer in a lower layer and a semiconductor layer in an upper layer which are stacked with a gate insulating layer, a planarization layer, an insulating layer in the upper layer, and the like interposed therebetween are electrically connected by a wiring layer which penetrates the gate insulating layer, the planarization layer, and the insulating layer in the upper layer. In the case where the semiconductor layer in the lower layer and the semiconductor layer in the upper layer are stacked so as to be overlapped with each other, the wiring layer may be formed to penetrate the semiconductor layer in the upper layer and to be in contact with the semiconductor layer in the lower layer. If the semiconductor layers are stacked closely so as to be overlapped with each other, higher integration of the semiconductor device can be achieved.

High performance semiconductor elements can be stacked; therefore, a higher integration of the semiconductor device can be achieved.

In formation of a semiconductor element in the upper layer over a semiconductor element in the lower layer, a planarization layer which covers the semiconductor element in the lower layer is formed and an insulating layer which is bonded to a semiconductor layer in the upper layer is formed over the planarization layer. Therefore, a bond between the semiconductor layer of the semiconductor element in the upper layer and the insulating layer is facilitated, whereby the reliability of the semiconductor device and the yield can be improved.

In addition, when the semiconductor layers of field-effect transistors are bonded to different insulating layers, parasitic capacitance between the semiconductor layers of the field-effect transistors or parasitic capacitance between gate electrode layers of the field-effect transistors can be reduced.

Since a semiconductor layer which is separated and transferred from a semiconductor substrate is used, a crystal plane orientation and a crystal axis of a channel length direction in the field-effect transistor can be controlled by selecting an appropriate semiconductor substrate.

By employing a crystal plane orientation or a crystal axis with which mobility of carriers flowing in a channel of the field-effect transistor is increased, the semiconductor device can be operated at higher speed. In addition, low voltage driving becomes possible, and low power consumption can be achieved. In other words, the possibility that carriers flowing in the channel of the field-effect transistor are scattered by atoms can be reduced, whereby resistance which electrons and holes meet with can be reduced, and performance of the field-effect transistor can be improved.

In bonding a supporting substrate to the semiconductor layer, a silicon oxide film which is preferably formed of organic silane is formed on one or both surfaces that are to form a bond and the silicon oxide film can be used as an insulating layer which is to be bonded to the semiconductor layer. Examples of organic silane gas that can be used are silicon-containing compounds such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). That is, in a structure in which a semiconductor layer is bonded to a supporting substrate, a layer which has a smooth surface and forms a hydrophilic surface is provided as a bonding surface.

Note that a chemical vapor deposition (CVD) method in this specification includes a plasma CVD method, a thermal CVD method, and a photo CVD method.

The silicon oxide film serving as the insulating layer which is to be bonded to the semiconductor layer can be formed by a chemical vapor deposition method using monosilane, disilane, or trisilane as a source gas. Further, the silicon oxide film serving as the insulating layer which is bonded to the semiconductor layer may be a thermal oxide film which preferably contains chlorine.

The semiconductor layer which is to be bonded to the supporting substrate can be obtained by cleavage and release at a fragile layer in the semiconductor substrate. The fragile layer can be formed by irradiation with ions of hydrogen, helium, or a halogen typified by fluorine. In this case, irradiation may be performed with ions of one atom or the same kind of atoms with different masses. In the case of irradiation with hydrogen ions, it is preferable that $H^+$, $H_2^+$, and $H_3^+$ ions be contained and the proportion of $H_3^+$ ions be high.

The supporting substrate may be provided with a silicon nitride film or a silicon nitride oxide film as a blocking layer (also referred to as a barrier layer) which prevents diffusion of impurity elements. Further, a silicon oxynitride film may be combined as an insulating film which has a function of relieving stress. Note that a silicon oxynitride film refers to a film that contains more oxygen than nitrogen and, in the case where measurements are performed using Rutherford backscattering spectrometry (RBS) and hydrogen forward scattering (HFS), includes oxygen, nitrogen, Si, and hydrogen at concentrations ranging from 50 to 70 at. %, 0.5 to 15 at. %, 25 to 35 at. %, and 0.1 to 10 at. %, respectively. Further, a silicon nitride oxide film refers to a film that contains more nitrogen than oxygen and, in the case where measurements are performed using RBS and HFS, includes oxygen, nitrogen, Si, and hydrogen at concentrations ranging from 5 to 30 at. %, 20 to 55 at. %, 25 to 35 at. %, and 10 to 30 at. %, respectively. Note that percentages of nitrogen, oxygen, Si, and hydrogen fall within the ranges given above, where the total number of atoms contained in the silicon oxynitride film or the silicon nitride oxide film is defined as 100 at. %.

In addition, a protection layer may be formed between the semiconductor substrate and the insulating layer which is bonded to the semiconductor layer. The protection layer can be a single layer or a laminate of layers selected from a silicon nitride layer, a silicon oxide layer, a silicon nitride oxide layer, or a silicon oxynitride layer. Those layers can be formed over the semiconductor substrate before the fragile layer is formed in the semiconductor substrate. Alternatively, those layers may be formed over the semiconductor substrate after the fragile layer is formed in the semiconductor substrate.

A mode of a semiconductor device according to the present invention is a semiconductor device including a plurality of field-effect transistors which are stacked with a planarization layer interposed therebetween over a substrate having an insulating surface, in which semiconductor layers in the plurality of field-effect transistors are separated from semiconductor substrates, and the semiconductor layers are bonded to an insulating layer formed over the substrate having an insulating surface or an insulating layer formed over the planarization layer.

A mode of a semiconductor device according to the present invention is a semiconductor device including a substrate having an insulating surface; a first field-effect transistor having a first semiconductor layer, a first gate insulating layer, a first gate electrode layer, a first source electrode layer, and a first drain electrode layer over the substrate having the insulating surface; a planarization layer over the first field-effect transistor; and a second field-effect transistor having a second semiconductor layer, a second gate insulating layer, a second gate electrode layer, a second source electrode layer, and a second drain electrode layer over the planarization layer, which forms a stacked structure with the first field-effect transistor and the planarization layer; in which the first field-effect transistor is bonded to a first insulating layer formed between the first semiconductor layer and the substrate having the insulating surface and is provided over the substrate having the insulating surface, and the second field-effect transistor is bonded to a second insulating layer provided over the planarization layer and is provided above the first field-effect transistor.

A mode of a semiconductor device according to the present invention is a semiconductor device including a substrate having an insulating surface; a first field-effect transistor having a first semiconductor layer, a first gate insulating layer, a first gate electrode layer, a first source electrode layer, and a first drain electrode layer over the substrate having the insulating surface; a planarization layer over the first field-effect transistor; and a second field-effect transistor having a second semiconductor layer, a second gate insulating layer, a second gate electrode layer, a second source electrode layer, and a second drain electrode layer over the planarization layer, which forms a stacked structure with the first field-effect transistor and the planarization layer; in which the first field-effect transistor is bonded to a first insulating layer formed between the first semiconductor layer and the substrate having the insulating surface and is provided over the substrate having the insulating surface, the second field-effect transistor is bonded to a second insulating layer provided over the planarization layer and is provided above the first field-effect transistor, and a crystal plane orientation of the first semiconductor layer and a crystal plane orientation of the second semiconductor layer are different from each other.

A mode of a semiconductor device according to the present invention is a semiconductor device including a substrate having an insulating surface; a first field-effect transistor having a first semiconductor layer, a first gate insulating layer, a first gate electrode layer, a first source electrode layer, and a first drain electrode layer over the substrate having the insulating surface; a planarization layer over the first field-effect transistor; and a second field-effect transistor having a second semiconductor layer, a second gate insulating layer, a second gate electrode layer, a second source electrode layer, and a second drain electrode layer over the planarization layer, which forms a stacked structure with the first field-effect transistor and the planarization layer; in which the first field-effect transistor is bonded to a first insulating layer formed between the first semiconductor layer and the substrate having the insulating surface and is provided over the substrate having the insulating surface, the second field-effect transistor is bonded to a second insulating layer provided over the planarization layer and is provided above the first field-effect transistor, and a crystal plane orientation of the first semiconductor layer and a crystal plane orientation of the second semiconductor layer are the same, and a crystal axis of a channel length direction of the first semiconductor layer and a crystal axis of a channel length direction of the second semiconductor layer are different from each other.

Note that in the present invention, a semiconductor device refers to a device which can function by utilizing the semiconductor characteristics. According to the present invention, a device having a circuit including semiconductor elements (e.g., transistors, memory elements, or diodes) or a semiconductor device such as a chip including a processor circuit can be manufactured.

Higher performance and lower power consumption can be achieved in semiconductor devices having an SOI structure.

DETAILED DESCRIPTION OF THE INVENTION

Figure 1A:
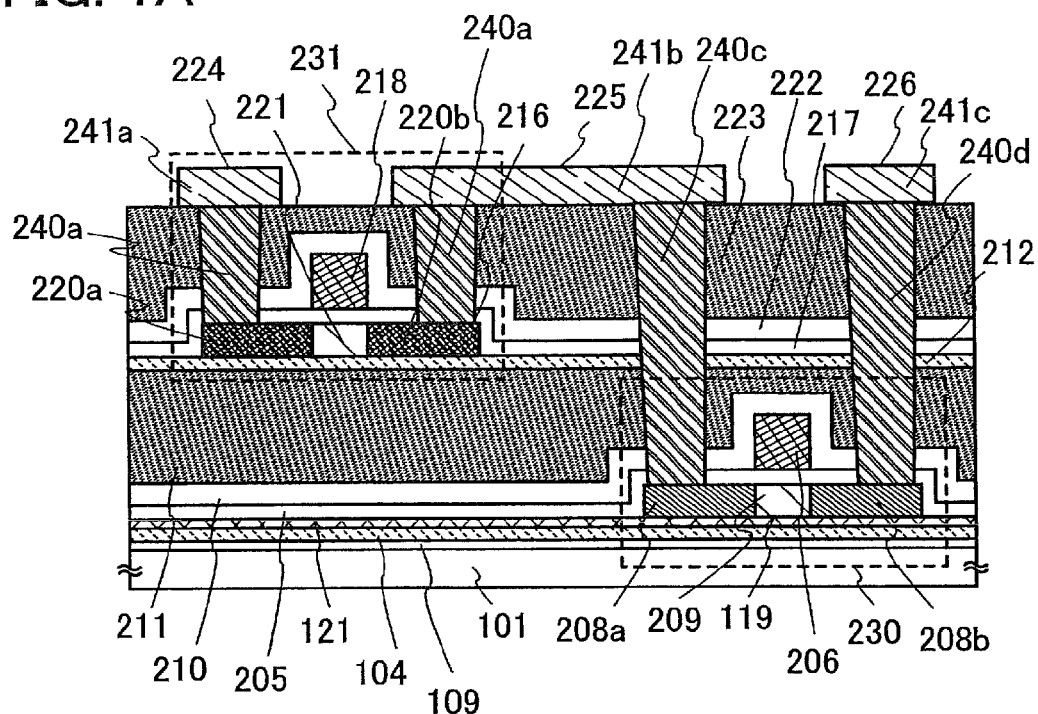
FIGS. 1A and 1B illustrate semiconductor devices of the present invention.

Embodiment modes of the present invention will be described in detail with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiment modes to be given below. Note that in a structure of the present invention described below, like portions or portions having like functions in different drawings are denoted by the like reference numerals and repeated description thereof is omitted.

Embodiment Mode 1

A method for manufacturing a semiconductor device of the present invention is described with reference to FIGS. 1A and 1B, FIGS. 2A and 2B, FIGS. 3A to 3D, and FIGS. 4A to 4D. This embodiment mode describes a complementary metal oxide semiconductor (CMOS) as an example of semiconductor devices which include more highly integrated and higher performance semiconductor elements.

In this embodiment mode, semiconductor elements are stacked with a planarization layer therebetween. The semiconductor elements include a semiconductor layer which is separated from a semiconductor substrate and is bonded to a supporting substrate having an insulating surface. A single-crystal semiconductor substrate is preferably used as the semiconductor substrate, and a single-crystal semiconductor layer is preferably formed as the semiconductor layer which is separated from the semiconductor substrate and bonded to the supporting substrate.

FIG. 1A illustrates a semiconductor device of this embodiment mode. A blocking layer 109, an insulating layer 104, a protection layer 121, a field-effect transistor 230, an insulating layer 210, a planarization layer 211, an insulating layer 212, a field-effect transistor 231, an insulating layer 222, and a planarization layer 223 are formed over a supporting substrate 101 having an insulating surface. The field-effect transistor 230 and the field-effect transistor 231 are thin film transistors which include a thin semiconductor layer. The field-effect transistor 230 includes a semiconductor layer 119 which includes impurity regions 208a and 208b, which are a source region and a drain region, and a channel formation region 209, a gate insulating layer 205, and a gate electrode layer 206. The field-effect transistor 231 includes a semiconductor layer 216 which includes impurity regions 220a and 220b, which are a source region and a drain region, and a channel formation region 221, a gate insulating layer 217, and a gate electrode layer 218. A wiring layer 226 is formed to be in contact with the impurity region 208b. A wiring layer 224 is formed to be in contact with the impurity region 220a. A wiring layer 225 which is formed to be in contact with the impurity region 208a and the impurity region 220b electrically connects the field-effect transistor 230 to the field-effect transistor 231.

Figure 1B:
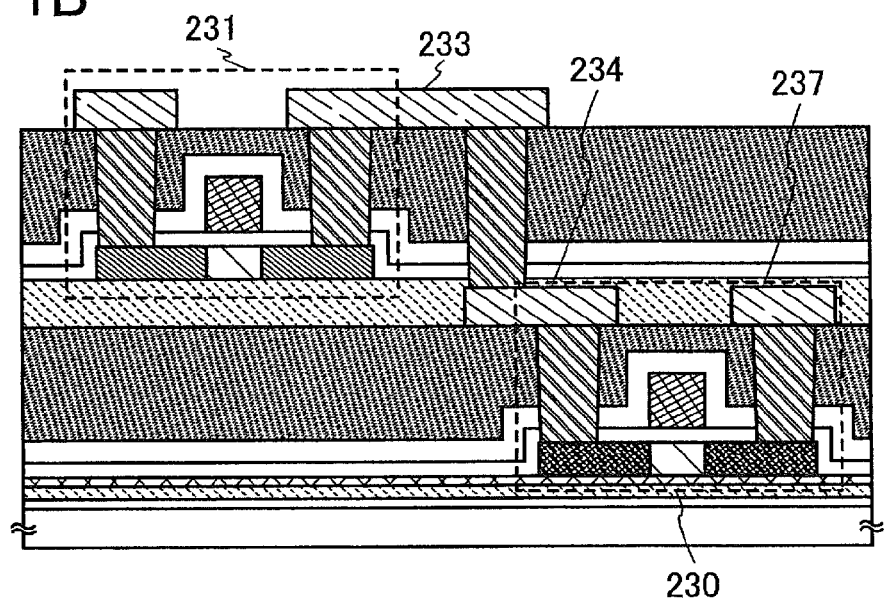

FIG. 1A illustrates an example of a semiconductor device in which the wiring layer 225 and the wiring layer 226 are formed in openings (contact holes) which successively penetrate the gate insulating layer 205, the insulating layer 210, the planarization layer 211, the insulating layer 212, the gate insulating layer 217, the insulating layer 222, and the planarization layer 223. FIG. 1B illustrates an alternative example of electrical connection between the field-effect transistor 230 and the field-effect transistor 231.

Figure 2A:
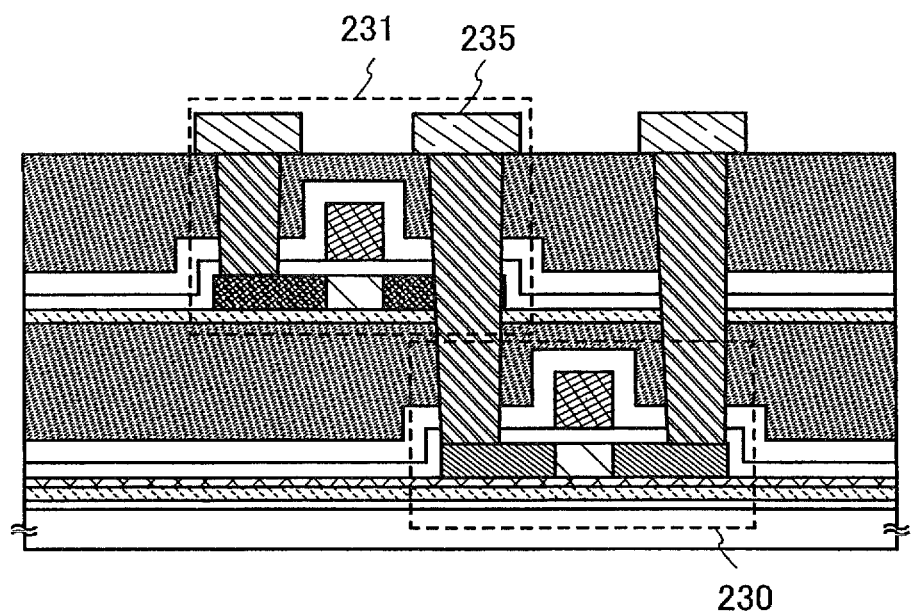
FIGS. 2A and 2B illustrate methods for manufacturing semiconductor devices of the present invention.
Figure 2B:
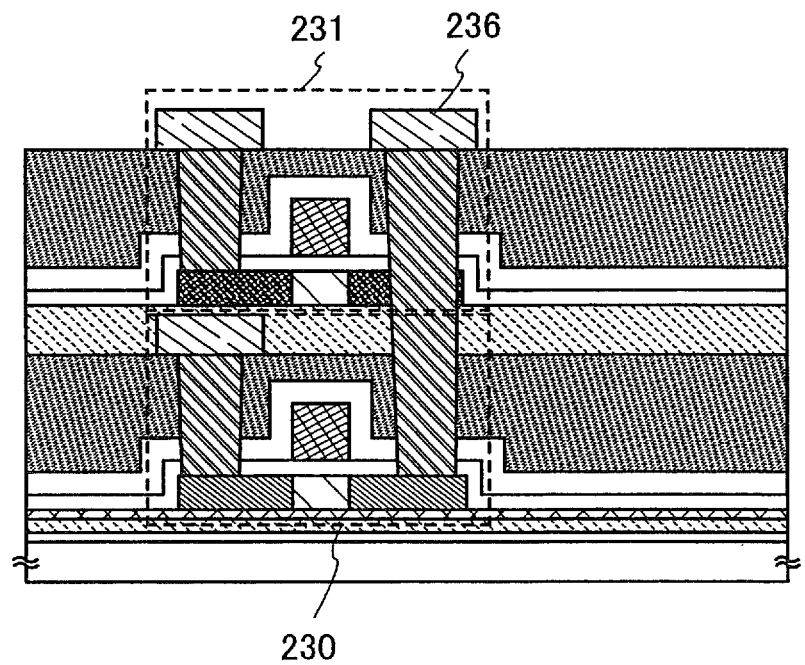

The wiring layers 224, 225, and 226 have a stacked structure in which wiring layers 240a, 240b, 240c, and 240d which are embedded wiring layers are formed to fill openings which are contact holes and then wiring layers 241a, 241b, and 241c which are lead wiring layers are formed over the embedded wiring layers. The wiring layers may include a barrier metal film or a seed film in the openings. Wiring layers 233, 234, 235, 236, and 237 in FIG. 1B and FIGS. 2A and 2B are wiring layers having a stacked structure similar to the wiring layers 224, 225, and 226.

Figure 21A:
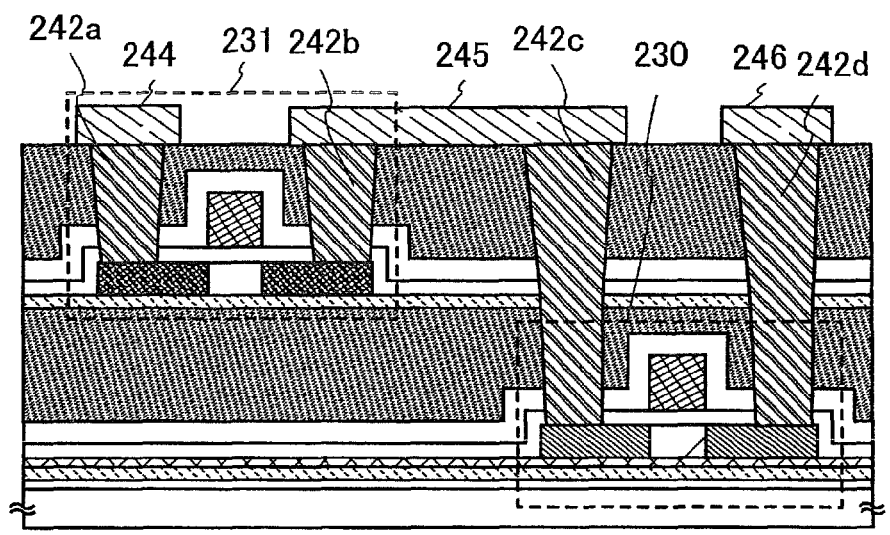
FIGS. 21A and 21B illustrate semiconductor devices of the present invention.

In the case where a contact hole for forming a wiring layer is formed in stacked layers including multiple layers, a side surface of the contact hole may have a plurality of taper angles. For example, in the case where an etching process include a plurality of steps which employ different etching gasses, taper angles and diameters of the opening may be varied depending on the etching conditions. FIG. 21A illustrates an example in which a wiring layer is formed in a contact hole having a plurality of taper angles. In a semiconductor device in FIG. 21A, contact holes in which wiring layers 242c and 242d which are embedded wiring layers of wiring layers 245 and 246 are formed have a first opening which is formed in the gate insulating layer 205, the insulating layer 210, the planarization layer 211, and the insulating layer 212; and a second opening which is formed in the gate insulating layer 217, the insulating layer 222, and the planarization layer 223. The first opening and the second opening are different in shape and the taper angle of the second opening is larger than that of the first opening.

Figure 21B:
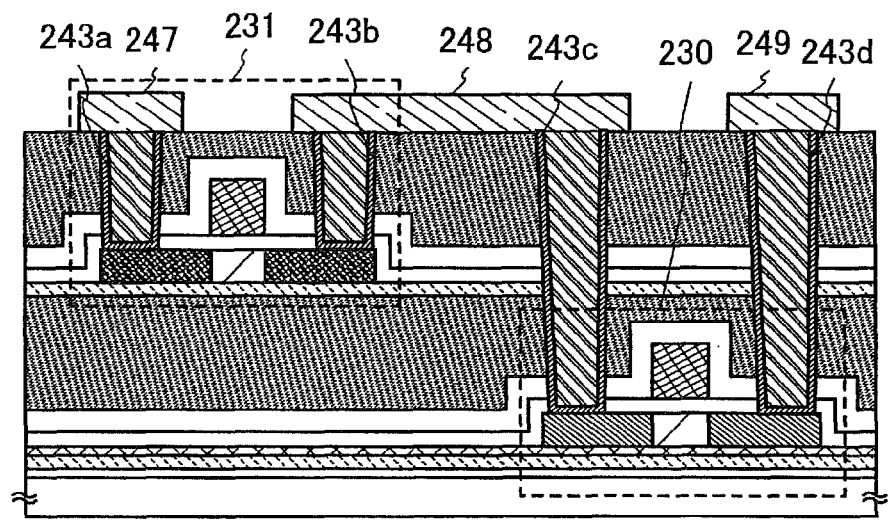

The wiring layer may include a barrier metal film or a seed film in the openings. An example in which a barrier metal film is formed is illustrated in FIG. 21B. In a semiconductor device in FIG. 21B, wiring layers 247, 248, and 249 include barrier metal films 243a, 243b, 243c, and 243d which are in contact with surfaces of contact holes.

A semiconductor device in FIG. 1B is an example in which after the planarization layer 211 which covers the field-effect transistor 230 is formed, openings which reach the impurity regions 208a and 208b are formed in the gate insulating layer 205, the insulating layer 210, and the planarization layer 211; and wiring layers 234 and 237 which are connected to the impurity regions 208a and 208b, respectively, are formed. The wiring layer 233 which is formed to be in contact with the impurity region 220b of the field-effect transistor 231 and the wiring layer 234 electrically connects the field-effect transistor 231 in the upper layer to the field-effect transistor 230 in the lower layer. In the case of FIG. 1B, another planarization layer may be formed over the wiring layers 234 and 237 to planarize projections and depressions due to the wiring layers 234 and 237 before the insulating layer 212 is formed. In FIG. 1B, the insulating layer 212 is formed to be thick so as to also serve as a planarization layer.

The field-effect transistors which are stacked have either n-type or p-type conductivity. FIG. 1A illustrates an example in which the field-effect transistor 230 in the lower layer is an n-channel field-effect transistor which includes n-type impurity regions as the impurity regions 208a and 208b, while the field-effect transistor 231 in the upper layer is a p-channel field-effect transistor which includes p-type impurity regions as the impurity regions 220a and 220b. On the other hand, FIG. 1B illustrates an example in which the field-effect transistor 230 in the lower layer is a p-channel field-effect transistor which includes p-type impurity regions as the impurity regions 208a and 208b and the field-effect transistor 231 in the upper layer is an n-channel field-effect transistor which includes n-type impurity regions as the impurity regions 220a and 220b.

A semiconductor layer in a lower layer and a semiconductor layer in an upper layer which are stacked with a gate insulating layer, a planarization layer, an insulating layer in the upper layer, and the like interposed therebetween are electrically connected by a wiring layer which penetrates the gate insulating layer, the planarization layer, and the insulating layer in the upper layer. In the case where the semiconductor layer in the lower layer and the semiconductor layer in the upper layer are stacked so as to be overlapped with each other, the wiring layer may be formed to penetrate the semiconductor layer in the upper layer and to be in contact with the semiconductor layer in the lower layer. If the semiconductor layers are stacked closely so as to be overlapped with each other, higher integration of the semiconductor device can be achieved.

FIGS. 2A and 2B illustrate semiconductor devices in which the semiconductor layer in the lower layer and the semiconductor layer in the upper layer are stacked so as to be overlapped with each other. In FIG. 2A, the semiconductor layer 119 (the impurity region 208a) in the field-effect transistor 230 which is the semiconductor element in the lower layer and the semiconductor layer 216 (the impurity region 220b) in the field-effect transistor 231 which is the semiconductor element in the upper layer are stacked to as to be overlapped with each other. The wiring layer 235 which electrically connects the field-effect transistor 230 to the field-effect transistor 231 is formed to penetrate the gate insulating layer 205, the insulating layer 210, the planarization layer 211, the insulating layer 212, the semiconductor layer 216 (the impurity region 220b), the gate insulating layer 217, the insulating layer 222, and the planarization layer 223 and to reach the semiconductor layer 119 (the impurity region 208a).

While the semiconductor layer 119 in the field-effect transistor 230 and the semiconductor layer 216 in the field-effect transistor 231 are partially overlapped with each other in FIG. 2A, they may be substantially overlapped with each other using the same mask or the like as illustrated in FIG. 2B. The larger the area in which the semiconductor layers are overlapped with each other is, the higher integration can be realized. In the semiconductor device in FIG. 2B, the field-effect transistor 230 and the field-effect transistor 231 are stacked to be almost completely overlapped with each other with the planarization layer therebetween. The wiring layer 236 which electrically connects the field-effect transistor 230 to the field-effect transistor 231 is formed to penetrate the gate insulating layer 205, the insulating layer 210, the planarization layer 211, the insulating layer 212, the semiconductor layer 216 (the impurity region 220b), the gate insulating layer 217, the insulating layer 222, and the planarization layer 223 and to reach the semiconductor layer 119 (the impurity region 208b).

Since a semiconductor device of the present invention has a structure in which semiconductor elements are stacked three dimensionally and are highly integrated, the semiconductor elements can be aligned side by side and in contact with one insulating layer or they can be stacked above and below with a planarization layer interposed therebetween and be in contact with different insulating layers. Therefore, arrangement flexibility of semiconductor elements in the semiconductor device is high, which can lead to further integration and higher performance. As a semiconductor element, not to mention a field-effect transistor, a memory element which uses a semiconductor layer can be employed; accordingly, a semiconductor device which can satisfy functions required for various applications can be manufactured and provided.

Further, since a semiconductor element which includes a semiconductor layer separated from a semiconductor substrate has smaller leak current caused by grain boundaries than a polycrystalline semiconductor layer which is obtained by crystallization, low power consumption of the semiconductor device can be realized. Further, variation in threshold values of semiconductor elements due to variation in crystal orientation is small. In addition, ridges on the semiconductor layer surface due to laser crystallization can be reduced; therefore, a gate insulating layer can be thinned.

All the field-effect transistors which are stacked may be n-channel field-effect transistors or may be p-channel field-effect transistors. Alternatively, a plurality of field-effect transistors may be provided to be in contact with one insulating layer and those field-effect transistors may include both an n-channel field-effect transistor and a p-channel field-effect transistor.

While this embodiment mode describes a laminate of two layers, a laminate of more than two layers may be employed. A plurality of semiconductor elements can be stacked by bonding an insulating layer provided over a planarization layer and an insulating layer provided over a semiconductor layer.

Since a semiconductor layer which is separated and transferred from a semiconductor substrate is used in a semiconductor device of this embodiment mode, a crystal plane orientation and crystal axes of a channel length direction in the field-effect transistor can be controlled by selecting a semiconductor substrate.

By employing a crystal orientation or a crystal axis with which mobility of carriers flowing in a channel of the field-effect transistor is increased, the semiconductor device can be operated at higher speed. In addition, low voltage driving becomes possible, and low power consumption can be achieved. In other words, the possibility that carriers flowing in the channel of the field-effect transistor are scattered by atoms can be reduced, whereby resistance which electrons and holes meet with can be reduced and performance of the field-effect transistor can be improved.

Hereinafter, a method for manufacturing a semiconductor device of this embodiment mode is described with reference to FIGS. 3A to 3D, FIGS. 4A to 4D, FIGS. 7A to 7F, and FIGS. 8A to 8D.

First, a method for providing a semiconductor layer over a supporting substrate having an insulating surface from a semiconductor substrate is described with reference to FIGS. 3A to 3D and FIGS. 4A to 4C.

Figure 3A:
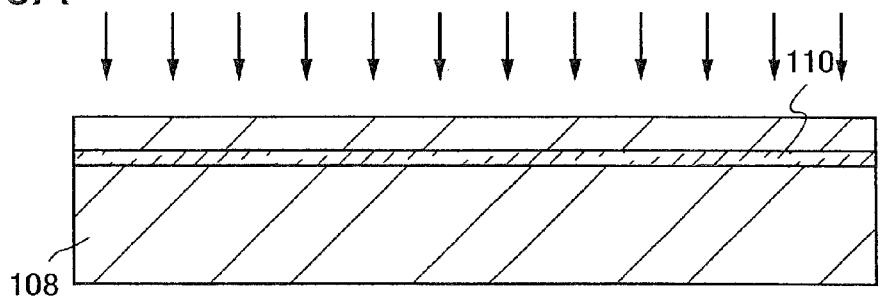
FIGS. 3A to 3D illustrate a method for manufacturing a semiconductor device of the present invention.

A semiconductor substrate 108 illustrated in FIG. 3A is cleaned, and the semiconductor substrate 108 is irradiated with ions that are accelerated by an electric field so as to reach a given depth from the surface of the semiconductor substrate 108 to form a fragile layer 110. Ion irradiation is performed in consideration of the thickness of a semiconductor layer which is to be transferred to a supporting substrate. An accelerating voltage for irradiating the semiconductor substrate 108 with ions is set in consideration of the thickness.

As the semiconductor substrate 108, a semiconductor substrate such as a silicon substrate or a germanium substrate, or a compound semiconductor substrate such as a gallium arsenide substrate or an indium phosphide substrate is used. The semiconductor substrate 108 is preferably a single-crystal semiconductor substrate, but it may be a polycrystalline semiconductor substrate. Further, a semiconductor substrate formed of silicon having a lattice distortion, silicon germanium in which germanium is added to silicon, or the like may be used. Silicon having a distortion can be formed by film formation of silicon on silicon germanium or silicon nitride which has a larger lattice constant than silicon. The semiconductor layer which is provided over the supporting substrate can be determined by a semiconductor substrate which is selected to be used as a base.

In addition, the crystal plane orientation of the semiconductor substrate 108 may be selected according to a semiconductor element which is to be formed (a field-effect transistor in this embodiment mode). For example, a semiconductor substrate having a {100} crystal plane orientation, a {110} crystal plane orientation, or the like can be used.

In this embodiment mode, an ion irradiation separation method in which hydrogen, helium, or fluorine is added to the given depth of the semiconductor substrate by ion irradiation, and then, heat treatment is performed and a semiconductor layer of a superficial part is separated is employed; however, a method in which single-crystal silicon is epitaxially grown over porous silicon, and then, a porous silicon layer is cleaved and released with water jet may be employed.

For example, a single-crystal silicon substrate is used as the semiconductor substrate 108, and the surface thereof is treated with dilute hydrofluoric acid so that a natural oxide film is removed as well as contaminant such as dust or the like attaching to the surface, whereby the surface of the semiconductor substrate 108 is cleaned.

The fragile layer 110 may be formed by irradiation with ions by an ion-doping method or an ion implantation method. The fragile layer 110 is formed by irradiating the semiconductor substrate 108 with ions of hydrogen, helium, or a halogen typified by fluorine. In the case of irradiation with fluorine ions as a halogen element, $BF_3$ may be used as a source gas. Note that an ion implantation method refers to a method in which a semiconductor is irradiated with an ionized gas on which mass separation is performed.

When the single-crystal silicon substrate is irradiated with halogen ions such as fluorine ions by an ion irradiation method, fluorine which is added knocks out (expels) silicon atoms in silicon crystal lattices, so that blank portions are formed effectively to make microvoids in the fragile layer. In this case, the volume of the microvoids formed in the fragile layer is changed by heat treatment at a relatively low temperature, and a thin single-crystal semiconductor layer can be formed by cleavage along the fragile layer. After irradiation with fluorine ions, irradiation with hydrogen ions may be performed so that hydrogen may be included in the voids. Since the cleavage is performed along the fragile layer which is formed to release a thin semiconductor layer from the semiconductor substrate by utilization of change in volume of the microvoids which are formed in the fragile layer, it is preferable to effectively utilize the action of fluorine ions and hydrogen ions in above-described manner.

Irradiation may be performed with ions of one atom or the same kind atoms with different masses. For example, in the case of irradiation with hydrogen ions, it is preferable that $H^+$, $H_2^+$, and $H_3^+$ ions be contained and the proportion of $H_3^+$ ions be high. In the case of irradiation with hydrogen ions, if $H^+$, $H_2^+$, and $H_3^+$ ions are contained and the proportion of $H_3^+$ ions is high, irradiation efficiency can be increased and irradiation time can be shortened. Such a structure facilitates the release.

Because there is a need for irradiation with ions at a high dose for forming the fragile layer, the surface of the semiconductor substrate 108 may be roughened. Therefore, a protection layer against ion irradiation, such as a silicon nitride film, a silicon nitride oxide film, or a silicon oxide film may be formed on the surface which is irradiated with ions to have a thickness of from 50 to 200 nm.

For example, a stacked layer of a silicon oxynitride film (with a thickness of 5 to 300 nm, preferably 30 to 150 nm (e.g., 50 nm)) and a silicon nitride oxide film (with a thickness of 5 to 150 nm, preferably 10 to 100 nm (e.g., 50 nm)) is formed by a plasma CVD method as the protection layer over the semiconductor substrate 108. As an example, a silicon oxynitride film is formed over the semiconductor substrate 108 to have a thickness of 50 nm, and a silicon nitride oxide film is formed thereover to have a thickness of 50 nm. The silicon oxynitride film may be a silicon oxide film which is manufactured by a chemical vapor deposition method using an organic silane gas.

Further, degreasing and cleaning may be performed on the semiconductor substrate 108 and an oxide film on the surface may be removed and thermal oxidation may be performed. As thermal oxidation, general dry oxidation may be performed; however, oxidation in an oxidizing atmosphere to which a halogen is added is preferably performed. For example, heat treatment is performed at a temperature of 700° C. or higher in an atmosphere containing HCl at 0.5 to 10 volume % (preferably 3 volume %) with respect to oxygen. The thermal oxidation is preferably performed at a temperature of 950 to 1100° C. The processing time may be 0.1 to 6 hours, preferably 0.5 to 3.5 hours. The film thickness of the oxide film which is formed is 10 to 1000 nm (preferably, 50 to 200 nm), for example, 100 nm.

As a substance including a halogen, one or more kinds selected from HF, $NF_3$, HBr, $Cl_2$, $ClF_3$, $BCl_3$, $F_2$, or $Br_2$ can be given besides HCl.

When heat treatment is performed within such a temperature range, a gettering effect by a halogen element can be obtained. Gettering particularly has an effect of removing metal impurities. In other words, impurities such as metal are turned into a volatile chloride, moved into the air, and removed by action of chlorine. The heat treatment is effective if being carried out on the semiconductor substrate 108 with its surface subjected to chemical mechanical polishing (CMP) treatment. Further, hydrogen has an effect of compensating defects at an interface between the semiconductor substrate 108 and the oxide film which is formed and reducing a local level density of the interface, and the interface between the semiconductor substrate 108 and the oxide film is inactivated and thus electric characteristics are stabilized.

A halogen can be contained in the oxide film formed by this heat treatment. Halogen elements are contained at a concentration of $1\times10^{17}$ to $5\times10^{20}$ atoms/cm$^3$, so that the oxide film can serve as a protection film which captures impurities such as metal and prevents contamination of the semiconductor substrate 108.

For forming the fragile layer 110, an accelerating voltage and the total number of ions can be adjusted in accordance with the thickness of a film deposited over the semiconductor substrate, the thickness of the semiconductor layer which is to be separated from the semiconductor substrate and transferred to the supporting substrate, and ion species which are used for irradiation.

For example, a hydrogen gas is used as a material, and irradiation with ions is performed at an accelerating voltage of 40 kV with the total number of ions of $2\times10^{16}$ ions/cm$^2$ by an ion doping method so that the fragile layer can be formed. If the thickness of the protection layer is increased and irradiation with ions is performed under the same condition to form the fragile layer, the thickness of a semiconductor layer which is separated from the semiconductor substrate and transferred to the supporting substrate can be decreased. For example, although it depends on the ratio of ion species ($H^+$ ions, $H_2^+$ ions, and $H_3^+$ ions), in the case where the fragile layer is formed under the above-described condition, if a silicon oxynitride film (with a thickness of 50 nm) and a silicon nitride oxide film (with a thickness of 50 nm) are stacked as a protection layer over the semiconductor substrate, the thickness of the semiconductor layer which is transferred to the supporting substrate is approximately 120 nm; whereas, if a silicon oxynitride film (with a thickness of 100 nm) and a silicon nitride oxide film (with a thickness of 50 nm) are stacked as a protection layer over the semiconductor substrate, the thickness of the semiconductor layer which is transferred to the supporting substrate is approximately 70 nm.

When helium (He) or hydrogen is used as a source gas, irradiation is performed with an accelerating voltage in the range of 10 to 200 kV and with a dose in the range of $1\times10^{16}$ to $6\times10^{16}$ ions/cm$^2$ so that the fragile layer can be formed. When helium is used as a source gas, irradiation can be performed with $He^+$ ions as the main ions without mass separation. Further, if hydrogen is used as a source gas, irradiation can be performed with $H_3^+$ ions or $H_2^+$ ions as the main ions. Ion species change depending on a plasma generation method, pressure, the supply of a source gas, and an accelerating voltage.

As an example of formation of the fragile layer, a silicon oxynitride film (with a thickness of 50 nm), a silicon nitride oxide film (with a thickness of 50 nm), and a silicon oxide film (with a thickness of 50 nm) are stacked as a protection layer over the semiconductor substrate, and irradiation with hydrogen is performed at an acceleration voltage of 40 kV and a dose of $2\times10^{16}$ ions/cm$^2$ to form the fragile layer in the semiconductor substrate. Then, a silicon oxide film (with a thickness of 50 nm) is formed as an insulating layer over the silicon oxide film, which is the top layer of the protection layer. As another example of formation of the fragile layer, a silicon oxide film (with a thickness of 100 nm) and a silicon nitride oxide film (with a thickness of 50 nm) are stacked as a protection layer over the semiconductor substrate, and irradiation with hydrogen is performed at an acceleration voltage of 40 kV and a dose of $2\times10^{16}$ ions/cm$^2$ to form the fragile layer in the semiconductor substrate. Then, a silicon oxide film (with a thickness of 50 nm) is formed as an insulating layer over the silicon nitride oxide film, which is the top layer of the protection layer. Note that the silicon oxynitride film and the silicon nitride oxide film may be formed by a plasma CVD method, and the silicon oxide film may be formed by a CVD method using an organic silane gas.

When a glass substrate which is used in the electronics industry, such as an aluminosilicate glass substrate, an aluminoborosilicate glass substrate, or a barium borosilicate glass substrate is employed as the supporting substrate 101, the glass substrate contains a slight amount of alkali metal such as sodium, and this slight amount of impurity may adversely affect the characteristics of a semiconductor element such as a transistor. The silicon nitride oxide film prevents such metal impurities contained in the supporting substrate 101 from diffusing from the supporting substrate 101 to the semiconductor substrate side. Note that a silicon nitride film may be formed as an alternative to the silicon nitride oxide film. A stress relieving layer such as a silicon oxynitride film or a silicon oxide film is preferably provided between the semiconductor substrate and the silicon nitride oxide film. When a stacked structure of the silicon nitride oxide film and the silicon oxynitride film is provided, diffusion of impurities to the semiconductor substrate can be prevented and stress distortion can be reduced.

Figure 3B:
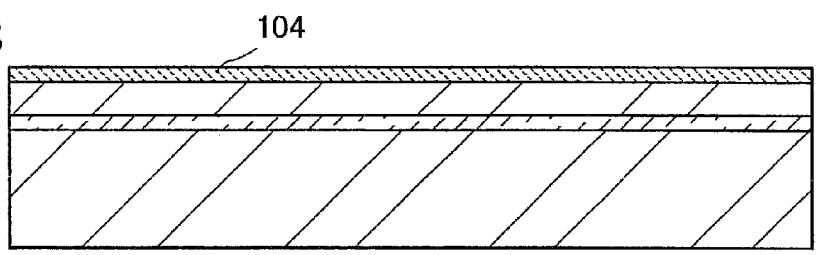

Next, as shown in FIG. 3B, a silicon oxide film is formed as the insulating layer 104 over a surface which is to form a bond with the supporting substrate. As the silicon oxide film, a silicon oxide film formed by a chemical vapor deposition method using an organic silane gas is preferable. Alternatively, a silicon oxide film formed by a chemical vapor deposition method using a silane gas can be employed. Film formation by a chemical vapor deposition method is performed at a temperature, for example, 350° C. or lower (a specific example is 300° C.) at which the fragile layer 110 that is formed in a single-crystal semiconductor substrate is not degassed. In addition, heat treatment which releases a single-crystal semiconductor layer or a polycrystalline semiconductor layer from a single-crystal semiconductor substrate or a polycrystalline semiconductor substrate employs a temperature which is higher than a temperature for the film formation.

The insulating layer 104 has a smooth surface and forms a hydrophilic surface. A silicon oxide film is suitably used as this insulating layer 104. In particular, a silicon oxide film which is formed by a chemical vapor deposition method using an organic silane gas is preferable. Examples of an organic silane gas that can be used are silicon-containing compounds, such as tetraethoxysilane (TEOS) (chemical formula: $Si(OC_2H_5)_4$), trimethylsilane (TMS: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$). Note that when the silicon oxide film is formed by a chemical vapor deposition method using organic silane as a source gas, a gas which provides oxygen is preferably mixed. As a gas which provides oxygen, oxygen, nitrous oxide, nitrogen dioxide, or the like can be used. In addition, an inert gas such as argon, helium, or nitrogen, or a hydrogen gas may be mixed. Alternatively, the insulating layer 104 can be a silicon oxide film which is formed by a chemical vapor deposition method using silane such as monosilane, disilane, or trisilane as a source gas. Also in this case, a gas which provides oxygen, an inert gas, or the like is preferably mixed. Film formation by a chemical vapor deposition method is performed at a temperature, for example, 350° C. or lower at which the fragile layer 110 that is formed in the a semiconductor substrate 108 is not degassed. In addition, heat treatment which releases a semiconductor layer from a single-crystal semiconductor substrate or a polycrystalline semiconductor substrate employs a temperature which is higher than a temperature for film formation. Note that a chemical vapor deposition method includes a plasma CVD method, a thermal CVD method, and a photo-CVD method.

Further, the insulating layer 104 can be formed using silicon oxide which is formed by heat treatment in an oxidizing atmosphere, a silicon oxide which grows by reaction of oxygen radicals, a chemical oxide which is formed with an oxidizing chemical solution, or the like. The insulating layer 104 may be an insulating layer having siloxane (Si—O—Si) bonds. Further, the insulating layer 104 may be formed by reaction between the organic silane gas and oxygen radicals or nitrogen radicals.

The insulating layer 104 which has a smooth surface and forms a hydrophilic surface is formed to have a thickness of 5 to 500 nm, preferably 10 to 200 nm. With this thickness, it is possible to smooth surface roughness of the insulating layer 104 and also to ensure smoothness of the insulating layer 104. In addition, distortion of the semiconductor substrate 108 and the supporting substrate that are bonded to each other can be eased. The surface of the insulating layer 104 is preferably set as follows: an arithmetic mean roughness Ra is less than 0.8 nm and a root-mean-square roughness Rms is less than 0.9 nm; more preferably, Ra is 0.4 nm or less and Rms is 0.5 nm or less; and still more preferably, Ra is 0.3 nm or less and Rms is 0.4 nm or less. For example, Ra is 0.27 nm and Rms is 0.34 nm. In this specification, Ra is arithmetic mean roughness, Rms is root-mean-square roughness, and the measurement area is 2 or 10 $\mu m^2$.

The supporting substrate 101 may be provided with a silicon oxide film similarly to the insulating layer 104. In other words, in bonding the semiconductor layer 102 to the supporting substrate 101, a strong bond can be formed when the insulating layer 104 formed of a silicon oxide film preferably using organic silane as a material is provided over one or both surfaces which are bonded to each other.

Figure 3C:
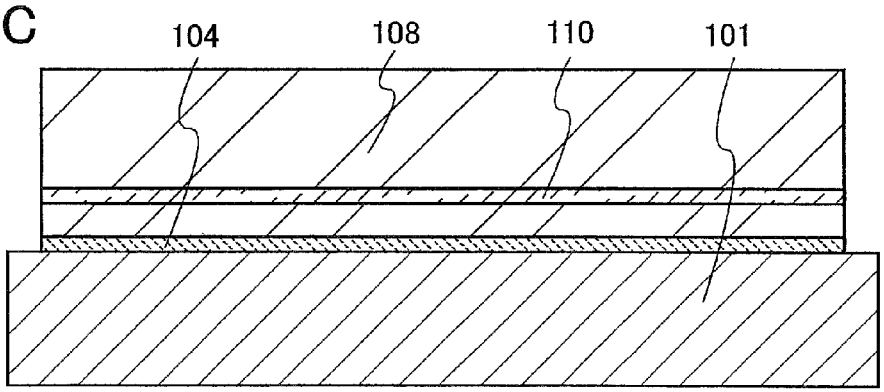

FIG. 3C illustrates a mode in which the supporting substrate 101 and a surface of the insulating layer 104 over the semiconductor substrate 108 are disposed in close contact with each other and bonded to each other. Surfaces that form the bond are sufficiently cleaned. The surfaces of the supporting substrate 101 and the insulating layer 104 over the semiconductor substrate 108 may be cleaned by megasonic cleaning or the like. Further, the surfaces may be cleaned with ozone water after the megasonic cleaning to remove an organic substance and to improve the hydrophilicity of the surfaces.

By making the supporting substrate 101 and the insulating layer 104 face each other and pressing a part thereof from outside, the distance between the bonding surfaces is locally reduced, whereby the supporting substrate 101 and the insulating layer 104 are attracted each other by increase in van der Waals forces or contribution of hydrogen bonding. Further, since the distance between the supporting substrate 101 and the insulating layer 104, which face each other, in an adjacent region is reduced, a region which is strongly influenced by van der Waals forces or a region to which hydrogen bonding contributes is widened. Accordingly, bonding proceeds and spreads to the entire bonding surfaces. A pressing pressure may be, for example, approximately 100 to 5000 kPa.

In order to form a favorable bond, the surfaces may be activated. For example, the surfaces which are to form a bond are irradiated with an atomic beam or an ion beam. In the case of using an atomic beam or an ion beam, an inert gas neutral atom beam or inert gas ion beam of argon or the like can be used. Further, plasma irradiation or radical treatment is performed. Such a surface treatment facilitates a bond between different kinds of materials even at a temperature of 200 to 400° C.

Further, in order to improve bonding strength at the bonding interface between the supporting substrate and the insulating layer, heat treatment is preferably performed. For example, heat treatment is performed in a temperature condition of 70 to 350° C. (e.g., at 200° C. for 2 hours) in an oven, a furnace, or the like.

Figure 3D:
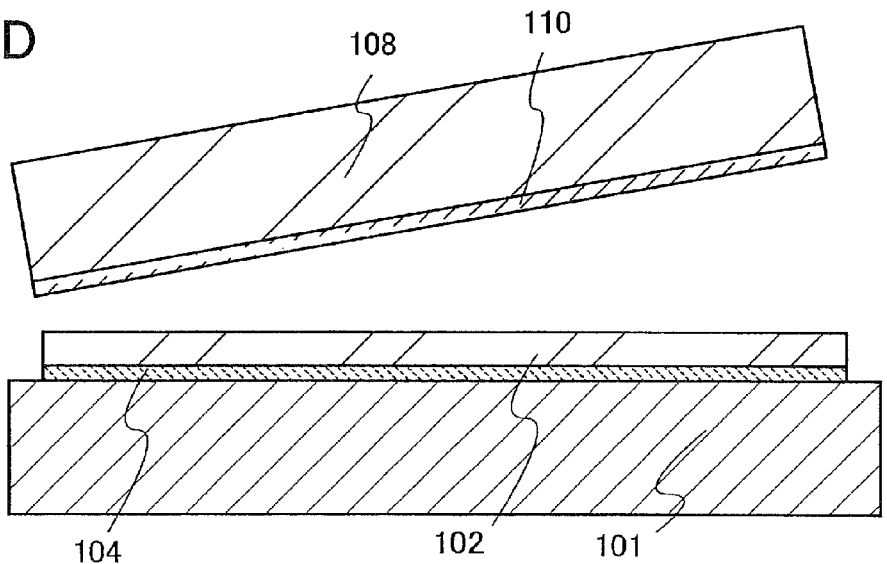

In FIG. 3D, after the supporting substrate 101 and the semiconductor substrate 108 are attached to each other, heat treatment is performed to release the semiconductor substrate 108 from the supporting substrate 101 with the fragile layer 110 serving as a cleavage plane. When the heat treatment is performed at, for example, 400 to 700° C., the volume of microvoids formed in the fragile layer 110 is changed, which enables cleavage to occur along the fragile layer 110. Since the insulating layer 104 is bonded to the supporting substrate 101, the semiconductor layer 102 having the same crystallinity as the semiconductor substrate 108 is left over the supporting substrate 101.

The heat treatment in the temperature range of 400 to 700° C. may be successively performed with the same apparatus as the above-described heat treatment for improving the bonding strength or with a different apparatus. For example, after heat treatment in a furnace at 200° C. for 2 hours, the temperature is increased to around 600° C., held for 2 hours, and decreased to be in a range from room temperature to 400° C., and then the substrates are taken out of the furnace. Alternatively, heat treatment may be performed with a temperature increasing from room temperature. Further alternatively, heat treatment may be performed in a furnace at 200° C. for 2 hours, and then, in a temperature range of 600 to 700° C. with a rapid thermal annealing (RTA) apparatus for 1 to 30 minutes (e.g., at 600° C. for 7 minutes or at 650° C. for 7 minutes).

By the heat treatment in the temperature range of 400 to 700° C., bonding between the insulating layer and the supporting substrate shifts from hydrogen bonding to covalent bonding, and the element which has been added to the fragile layer is taken out and the pressure rises, whereby the semiconductor layer can be released from the semiconductor substrate. After the heat treatment, the supporting substrate and the semiconductor substrate are in a state where one of them is located over the other, and the supporting substrate and the semiconductor substrate can be separated from each other without large force. For example, one substrate located over the other substrate is lifted with a vacuum chuck, so that the supporting substrate and the semiconductor substrate can be easily separated. At this time, if the lower substrate is fastened with a vacuum chuck or a mechanical chuck, the supporting substrate and the semiconductor substrate can be separated from each other without horizontal deviation.

Note that although an example in which the semiconductor substrate 108 is smaller than the supporting substrate 101 is shown in FIGS. 3A to 3C and FIGS. 4A to 4D, the present invention is not limited thereto. The semiconductor substrate 108 and the supporting substrate 101 may be the same size or the semiconductor substrate 108 may be larger than the supporting substrate 101.

Figure 4A:
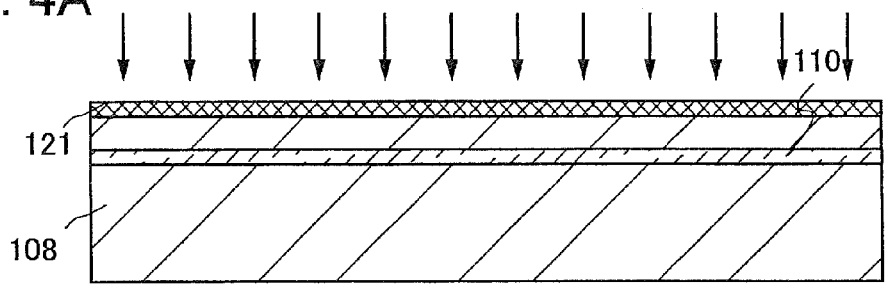
FIGS. 4A to 4D illustrate a method for manufacturing a semiconductor device of the present invention.

FIGS. 4A to 4D illustrate steps of forming a semiconductor layer using an insulating layer which is bonded to the semiconductor layer and which is provided over the supporting substrate. FIG. 4A shows a step in which the semiconductor substrate 108, which is provided with a silicon oxide film serving as the protection layer 121, is irradiated with ions that are accelerated by an electric field so as to reach a given depth to form the fragile layer 110. Ion irradiation is performed similarly to the case of FIG. 3A. Formation of the protection layer 121 over the surface of the semiconductor substrate 108 can prevent the surface from being damaged and from losing the planarity due to ion irradiation. Further, the protection layer 121 has an effect of preventing diffusion of impurities into the semiconductor layer 102 which is formed using the semiconductor substrate 108.

Figure 4B:
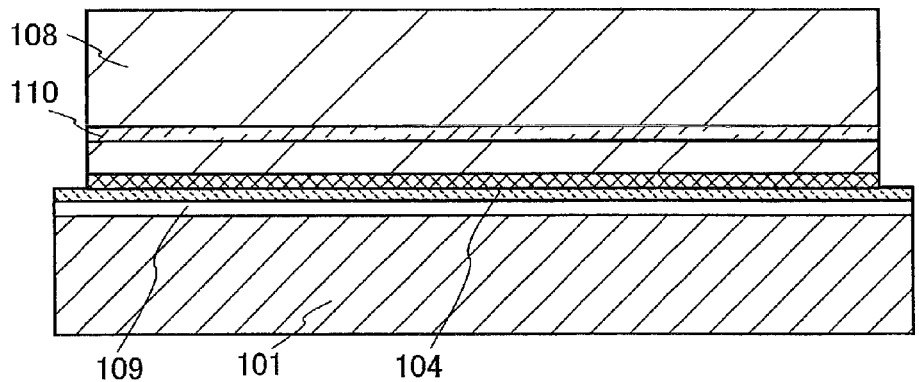

FIG. 4B shows a step in which the supporting substrate 101, over which the blocking layer 109 and the insulating layer 104 are formed, and a surface of the protective layer 121, which is formed over the semiconductor substrate 108, are disposed to be in close contact with each other and bonded. The insulating layer 104 over the supporting substrate 101 is disposed in close contact with the protection layer 121 of the semiconductor substrate 108 so that they are bonded to each other.

Figure 4C:
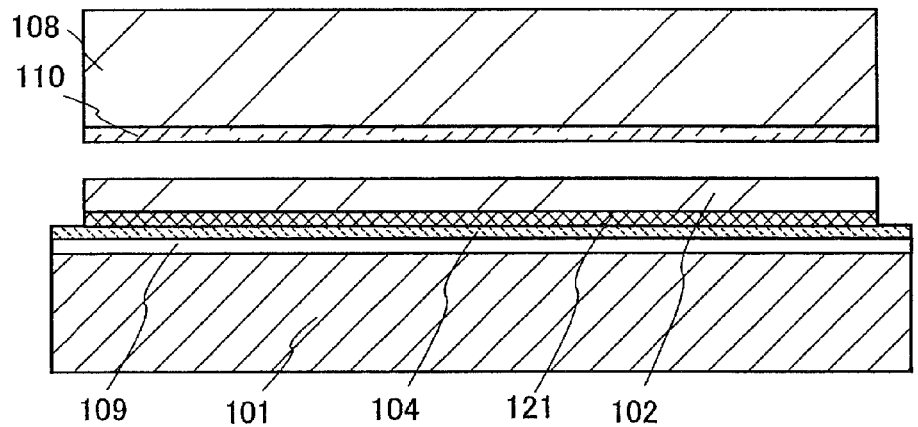
Figure 4D:
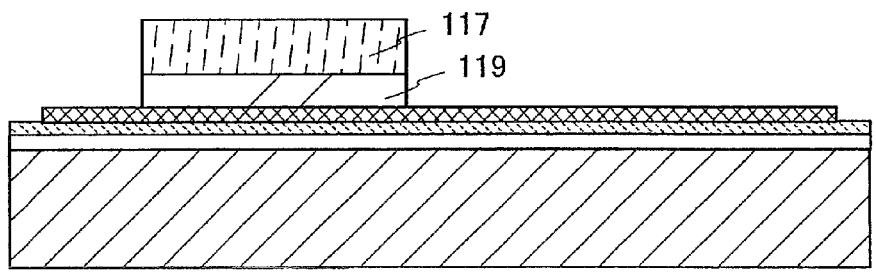

After that, the semiconductor substrate 108 is released as illustrated in FIG. 4C. Heat treatment for releasing the semiconductor layer is performed similarly to the case of FIG. 3D. The heat treatment in bonding and separating steps is performed at a temperature equal to or lower than the temperature at which heat treatment is performed on the supporting substrate 101 in advance. Thus, the semiconductor substrate illustrated in FIG. 4C can be obtained.

As the supporting substrate 101, a substrate having an insulating property or a substrate having an insulating surface can be used, and it is possible to employ any of a variety of glass substrates that are used in the electronics industry and referred to as non-alkali glass substrates, such as an aluminosilicate glass substrate, an aluminoborosilicate glass substrate, or a barium borosilicate glass substrate. Further, a quartz substrate, a ceramic substrate, a sapphire substrate, a metal substrate whose surface is coated with an insulating layer, or the like can be used.

Through the above-described process, as illustrated in FIG. 4C, the insulating layer 104 is formed over the supporting substrate 101 having an insulating surface and the semiconductor layer 102, which is separated from the semiconductor substrate 108, is provided over the supporting substrate 101.

The semiconductor layer 102 provided over the supporting substrate 101 is etched into an island shape. A mask 117 is formed over the semiconductor layer 102. A semiconductor layer 119 having an island shape is formed by etching the semiconductor layer 102 using the mask 117 (see FIG. 4D). While FIGS. 4A to 4D illustrate an example in which the protection layer and the insulating layer below the semiconductor layer are not etched in the etching treatment for forming the semiconductor layer 119, the protection layer and the insulating layer may also be etched in the etching treatment for forming the semiconductor layer 119. In this case, the protection layer and the insulating layer reflect the shape of the semiconductor layer 119 having an island shape and provided only under the semiconductor layer 119.

The semiconductor layer which is separated from the semiconductor substrate and is transferred to the supporting substrate may have crystal defects due to the separation step and the ion irradiation step, and may lose surface planarity and have projections and depressions. When a transistor is formed as a semiconductor element using the semiconductor layer, it is difficult to form a thin gate insulating layer with high withstand voltage on the surface of the semiconductor layer with such projections and depressions. In addition, if the semiconductor layer has a crystal defect, performance and reliability of the transistor are adversely affected; for example, a local interface state density with the gate insulating layer is increased.

Therefore, the semiconductor layer is preferably irradiated with an electromagnetic wave such as laser light to reduce crystal defects. Irradiation with an electromagnetic wave can melt the semiconductor layer at least partially and can reduce crystal defects in the semiconductor layer. Note that an oxide film (a natural oxide film or a chemical oxide film) formed on the surface of the semiconductor layer may be removed with dilute hydrofluoric acid before irradiation with an electromagnetic wave.

Any electromagnetic wave may be used as long as it can supply high energy to the semiconductor layer, and laser light can be preferably used.

The energy supply to the semiconductor layer can be mainly performed by heat conduction by collision of particles having high energy with the semiconductor layer by irradiation or the like. As a heat source for providing particles having high energy, plasma such as normal-pressure plasma, high-pressure plasma, or a thermal plasma jet, or flame of a gas burner or the like can be used. Alternatively, an electron beam or the like can be used as a heat source.

A wavelength of an electromagnetic wave is set so that it is absorbed by the semiconductor layer. The wavelength can be determined in consideration of the skin depth and the like of the electromagnetic wave. For example, the wavelength of the electromagnetic wave can be 190 to 600 nm. Further, electromagnetic wave energy can be determined in consideration of the wavelength of the electromagnetic wave, the skin depth of the electromagnetic wave, the thickness of the semiconductor layer to be irradiated, or the like.

A laser emitting the laser light can be a continuous wave laser, a quasi-continuous wave laser, or a pulsed laser. A pulsed laser is preferable for partial melting. For example, a gas laser such as an excimer laser such as a KrF laser, an Ar laser, a Kr laser, or the like can be used. Alternatively, as a solid state laser, a YAG laser, a YVO$_4$ laser, a YLF laser, a YAlO$_3$ laser, a GdVO$_4$ laser, a KGW laser, a KYW laser, an Alexandrite laser, a Ti: sapphire laser, a Y$_2$O$_3$ laser, or the like can be used. While an excimer laser is a pulsed laser, some solid lasers such as a YAG laser can also be used as a continuous laser, a quasi-continuous laser, and a pulsed laser. Note that in a solid state laser, any of the second harmonic to the fifth harmonic of a fundamental wave is preferably used. In addition, a semiconductor laser such as GaN, GaAs, GaAlAs, InGaAsP, or the like can be used.

As long as the semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. Flash annealing using the above-mentioned lamp light may be used. Since flash annealing which is performed by preferably using a halogen lamp, a xenon lamp, or the like takes a very short treatment time, increase in temperature of the supporting substrate can be suppressed.

A shutter; a reflector such as a mirror or a half mirror; an optical system including a cylindrical lens, a convex lens, or the like may be provided to adjust the shape or path of the electromagnetic wave.

Note that as for an irradiation method with the electromagnetic wave, the semiconductor layer can be selectively irradiated with the electromagnetic wave or the semiconductor layer can be irradiated with light (the electromagnetic wave) by scanning the light (the electromagnetic wave) in the XY axes directions. In this case, a polygon mirror or a galvanometer mirror is preferably used for the optical system.

Irradiation with the electromagnetic wave can be performed in an atmosphere which contains oxygen, such as an air atmosphere or in an inert atmosphere such as a nitrogen atmosphere. To perform irradiation with the electromagnetic wave in an inert atmosphere, irradiation with the electromagnetic wave may be performed in an airtight chamber, and the atmosphere in this chamber may be controlled. In the case where a chamber is not used, a nitrogen atmosphere can be formed by spraying an inert gas such as a nitrogen gas or the like on a surface irradiated with the electromagnetic wave.

Further, polishing treatment may be performed on the surface of the semiconductor layer to which high energy is supplied by electromagnetic wave irradiation or the like to reduce crystal defects of the surface. Polishing treatment can enhance the planarity of the surface of the semiconductor layer.

For the polishing treatment, a chemical mechanical polishing (CMP) method or a liquid jet polishing method can be used. Note that the surface of the semiconductor layer is cleaned and purified before the polishing treatment. The cleaning may be megasonic cleaning, two-fluid jet cleaning, or the like and dust or the like on the surface of the semiconductor layer is removed by cleaning. In addition, it is preferable to remove a natural oxide film or the like on the surface of the semiconductor layer to expose the semiconductor layer by using dilute hydrofluoric acid.

In addition, the surface of the semiconductor layer may be subjected to polishing treatment (or etching treatment) before the electromagnetic wave irradiation.

In this embodiment mode, when a single-crystal silicon substrate is used as the semiconductor substrate 108, a single-crystal silicon layer can be obtained as the semiconductor layer 119. Further, since a method for manufacturing an SOI substrate of a semiconductor device in this embodiment mode allows a process temperature to be 700° C. or lower, a glass substrate can be employed as the supporting substrate 101. That is, similarly to a conventional thin film transistor, the transistor in this embodiment mode can be formed over a glass substrate and a single-crystal silicon layer can be employed as the semiconductor layer. Accordingly, a transistor with high performance and high reliability which can, for example, operate at high speed and low driving voltage and have a low subthreshold swing and high electron field-effect mobility can be manufactured over a supporting substrate such as a glass substrate.

Next, a method for manufacturing the semiconductor device illustrated in FIG. 1A which employs the SOI substrate manufactured as described above is described with reference to FIGS. 7A to 7F and FIGS. 8A to 8D.

Figure 7A:
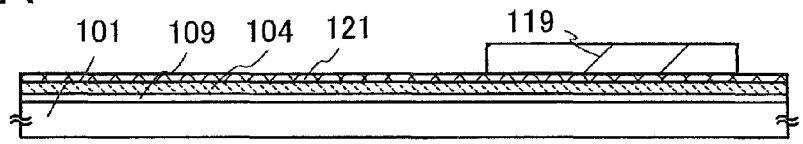
FIGS. 7A to 7F illustrate a semiconductor device of the present invention.

In FIG. 7A, the blocking layer 109, the insulating layer 104, the protection layer 121, and the semiconductor layer 119 are formed over the supporting substrate 101. The semiconductor layer 119, the blocking layer 109, the insulating layer 104, and the protection layer 121 correspond to those in FIGS. 4A to 4D. Note that while an example which employs the SOI substrate having the structure illustrated in FIG. 7A is given here, the SOI substrate having another structure described in this specification can be employed.

In the semiconductor layer 119, a p-type impurity such as boron, aluminum, or gallium or an n-type impurity such as phosphorus or arsenic is preferably added to a region where an n-channel field-effect transistor or a p-channel field-effect transistor is to be formed. In other words, a p-type impurity is added to a region where an n-channel field-effect transistor is to be formed and an n-type impurity is added to a region where a p-channel field-effect transistor is to be formed, so that so-called well regions are formed. The dose of impurity ions may be approximately $1\times10^{12}$ to $1\times10^{14}$ ions/cm$^2$. Further, in the case of adjusting the threshold voltage of the field-effect transistor, a p-type or n-type impurity may be added to the well regions.

The semiconductor layer 119 may be further etched to have island shapes in accordance with arrangement of the semiconductor elements.

An oxide film over the semiconductor layer is removed and a gate insulating layer 205 is formed to cover the semiconductor layer 119.

The gate insulating layer 205 may be formed using silicon oxide, or may be formed with a stacked-layer structure of silicon oxide and silicon nitride. The gate insulating layer 205 may be formed by depositing an insulating film by a plasma CVD method or a low-pressure CVD method. Alternatively, the gate insulating layer 205 may be formed by solid-phase oxidation or solid-phase nitridation with plasma treatment because a gate insulating layer which is formed by oxidizing or nitriding a semiconductor layer by plasma treatment is dense, has high withstand voltage, and is highly reliable.

Further, as the gate insulating layer 205, a high dielectric constant material such as zirconium dioxide, hafnium oxide, titanium dioxide, or tantalum pentoxide may be used. When a high dielectric constant material is used for the gate insulating layer 205, gate leak current can be reduced.

Figure 7B:
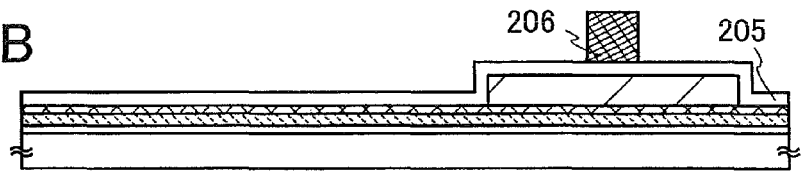
Figure 7C:
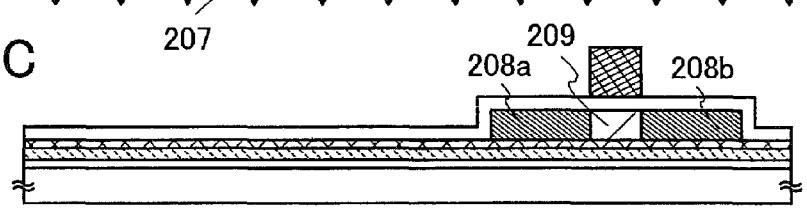
Figure 7D:
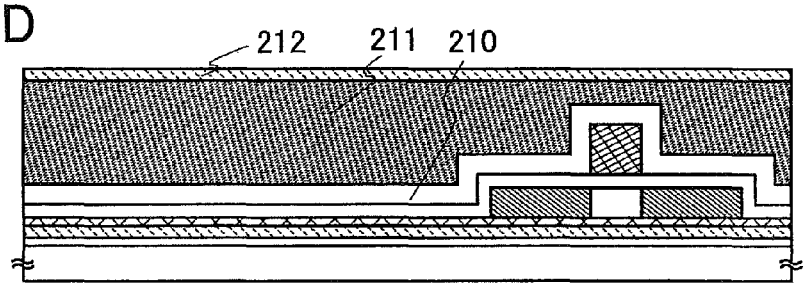

The gate electrode layer 206 is formed over the gate insulating layer 205 (see FIG. 7B). The gate electrode layer 206 can be formed by a sputtering method, an evaporation method, a CVD method, or the like. The gate electrode layer 206 may be formed using an element selected from tantalum (Ta), tungsten (W), titanium (Ti), molybdenum (Mo), aluminum (Al), copper (Cu), chromium (Cr), or neodymium (Nd), or an alloy material or compound material containing any of those elements as its main component. Further, as the gate electrode layer 206, a semiconductor film typified by a polycrystalline silicon film doped with an impurity element such as phosphorus can be used, or an AgPdCu alloy may be used.

The impurity regions 208a and 208b, which are n-type impurity regions, are formed by adding an impurity element 207 imparting n-type conductivity using the gate electrode layer 206 as a mask. In this embodiment mode, phosphine ($PH_3$) is used as a doping gas containing an impurity element. Here, doping is performed such that the impurity regions 208a and 208b contain the impurity element imparting n-type conductivity at a concentration of approximately $5 \times 10^{19}$ to $5 \times 10^{20}$ atoms/$cm^3$. In addition, the channel formation region 209 is formed in the semiconductor layer 119 (see FIG. 7C).

The impurity regions 208a and 208b are n-type high-concentration impurity regions and serve as a source and a drain.

Heat treatment, intense light irradiation, or laser light irradiation may be performed to activate the impurity element, which can repair plasma damage of the gate insulating layer and of the interface between the gate insulating layer and the semiconductor layer as well as activation.

Subsequently, an interlayer insulating layer which covers the gate electrode layer and the gate insulating layer is formed. In this embodiment mode, the interlayer insulating layer is a stacked layer of the insulating layer 210 which contains hydrogen and serves as a protection film and the planarization layer 211 (see FIG. 7D).

Further, heat treatment is performed in a nitrogen atmosphere at 300 to 550° C. for 1 to 12 hours to hydrogenate the semiconductor layer. Preferably, this heat treatment is performed at 400 to 500° C. This step terminates dangling bonds of the semiconductor layer with hydrogen which is contained in the insulating layer 210, which is the interlayer insulating layer. In this embodiment mode, the heat treatment is performed at 410° C. for one hour.

In the present invention, the planarization layer 211 is formed to relieve projections and depressions on the surface which are generated by the semiconductor layer, the gate electrode layer, and the like and to planarize the surface. Accordingly, the planarization layer 211 is formed to have a thickness with which the surface thereof is planarized. Note that the surface may be planarized by chemical mechanical polishing (CMP).

The insulating layer 210 and the planarization layer 211 may be a silicon nitride film, a silicon nitride oxide film, a silicon oxynitride film, or a silicon oxide film which are formed by a sputtering method or plasma CVD. Alternatively, a single layer or a stacked layer of three or more layers which includes another insulating film containing silicon may be used.

The insulating layer 210 and the planarization layer 211 can be formed of a material selected from aluminum nitride (AlN), aluminum oxynitride (AlON), aluminum nitride oxide (AlNO) containing more nitrogen than oxygen, aluminum oxide, diamond-like carbon (DLC), nitrogen-containing carbon (CN), or another inorganic insulating substance. Further, a siloxane resin may be used. Note that a siloxane resin refers to a resin including an Si—O—Si bond. Siloxane has a skeleton formed by a bond of silicon (Si) and oxygen (O), in which an organic group containing at least hydrogen (such as an alkyl group or aromatic hydrocarbon) is used as a substituent. The organic group may include a fluoro group.

Alternatively, an organic insulating material which can withstand subsequent heat treatment may be used. As such an organic material, polyimide, acrylic, polyamide, polyimide amide, resist, benzocyclobutene, or polysilazane can be given. A coated film which is formed by a coating method and has favorable planarity may be used as the planarization layer 211.

Dip coating, spray coating, a doctor knife, a roll coater, a curtain coater, a knife coater, a CVD method, an evaporation method, or the like can be used for forming the insulating layer 210 and the planarization layer 211. The insulating layer 210 and the planarization layer 211 may be formed by a droplet discharge method. If a droplet discharge method is used, a material liquid can be saved. In addition, a method capable of transferring or drawing a pattern like a droplet discharge method, for example, a printing method (a method for forming a pattern, such as screen printing or offset printing) can be used.

The insulating layer 212 is formed over the planarization layer 211 as an insulating layer which is bonded to a second semiconductor layer. The material and forming step of the insulating layer 212 may be similar to those for the insulating layer 104. The insulating layer 212 can be a smooth layer (an arithmetic mean roughness Ra is less than 0.3 nm (a measurement area 10 $\mu m^2$)) and a silicon oxide film or a silicon oxynitride film, a laminate of a silicon nitride film and a silicon oxide film stacked in that order over the planarization layer 211, or a laminate of a silicon oxynitride film and a silicon oxide film stacked in that order over the planarization layer 211. The insulating layer 212 is preferably formed by a PECVD method at a low temperature of 350° C. or lower. For example, in this embodiment mode, a silicon oxide film is formed as the insulating layer 212, using tetraethoxysilane as an organic silane gas by a chemical vapor deposition method. A silicon nitride film or silicon oxynitride film prevents impurities from diffusing from the planarization layer 211 through the insulating layer 212 to a semiconductor layer 215 and the gate insulating layer 217 which are formed thereover.

Figure 7E:
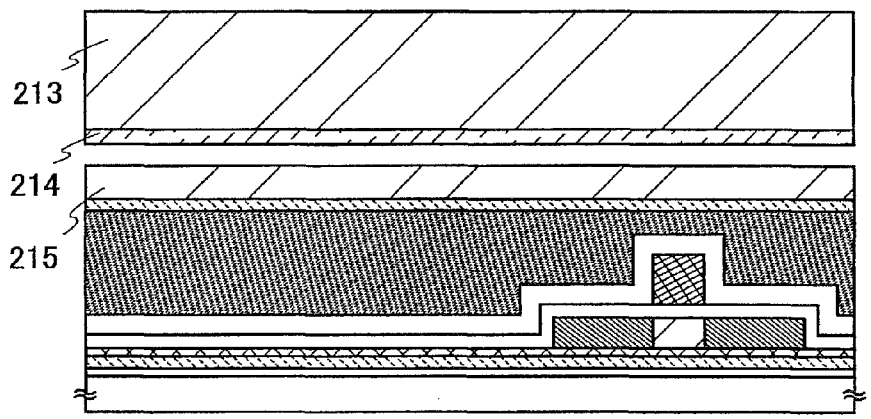

The semiconductor layer 215 is bonded to the insulating layer 212 to be formed over the planarization layer 211 in a similar manner in which the semiconductor layer 102 is bonded to the insulating layer 104 and is separated from the semiconductor substrate 108 (see FIG. 7E). The semiconductor layer 215 is separated from the semiconductor substrate 213 in which a fragile layer 214 is formed and is bonded to the insulating layer 212 with heat treatment.

The semiconductor layer 215 may be irradiated with laser light to reduce crystal defects. Further, the surface of the semiconductor layer 215 may be subjected to polishing treatment. Polishing treatment can enhance the planarity of the surface of the semiconductor layer 215.

Note that in this embodiment mode, a single-crystal semiconductor substrate with a {100} crystal plane orientation is selected as the semiconductor substrate 108, which is a first semiconductor substrate, while a single-crystal semiconductor substrate with a {110} crystal plane orientation is selected as the semiconductor substrate 213, which is a second semiconductor substrate. Note that a combination of the crystal plane orientation of the first semiconductor substrate and the crystal plane orientation of the second semiconductor substrate is not limited to the combination in this embodiment mode. For example, a substrate with a {110} crystal plane orientation may be used as the first semiconductor substrate, and a substrate with a {100} crystal plane orientation may be used as the second semiconductor substrate. In that case, it is preferable that a p-channel field-effect transistor be manufactured using the first semiconductor substrate and an n-channel field-effect transistor be manufactured using the second semiconductor substrate.

Figure 7F:
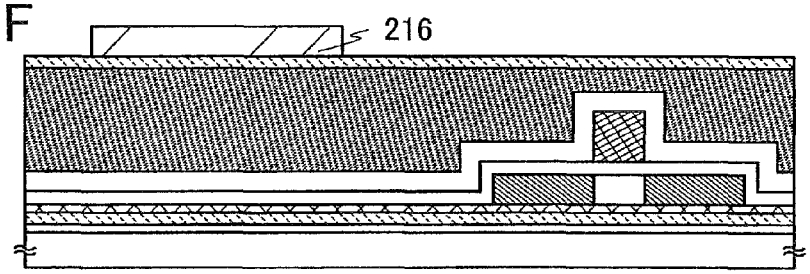

Then, the semiconductor layer 215, which is a thin film, is selectively etched to form the semiconductor layer 216 having an island shape over the insulating layer 212 (see FIG. 7F).

Figure 8A:
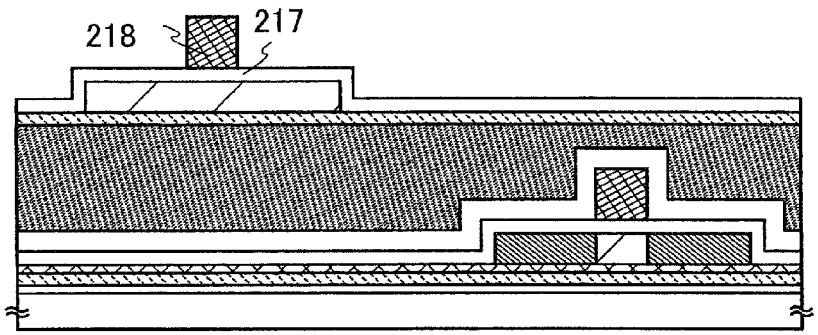
FIGS. 8A to 8D illustrate a semiconductor device of the present invention.
Figure 8B:
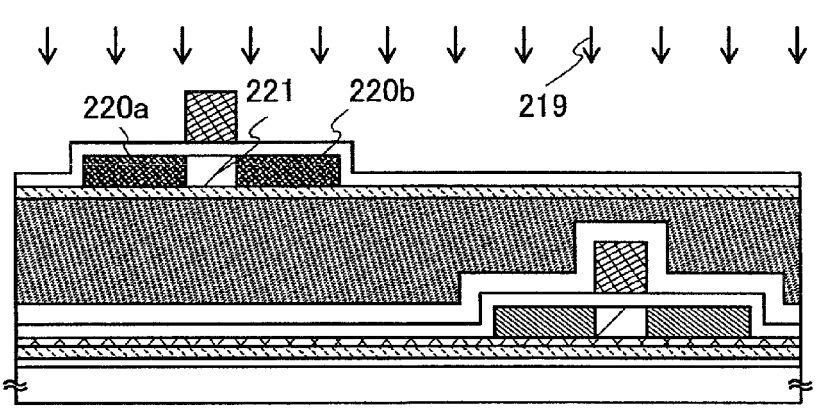

The gate insulating layer 217 and the gate electrode layer 218 are formed over the semiconductor layer 216 (see FIG. 8A).

The impurity regions 220a and 220b, which are p-type impurity regions, are formed by adding an impurity element 219 imparting p-type conductivity using the gate electrode layer 218 as a mask. Doping is performed such that the impurity regions 220a and 220b contain the impurity element imparting p-type conductivity at a concentration of approximately $1 \times 10^{20}$ to $5 \times 10^{21}$ atoms/cm$^3$. In addition, the channel formation region 221 is formed in the semiconductor layer 216 (see FIG. 8B). The impurity regions 220a and 220b are p-type high-concentration impurity regions and serve as a source and a drain.

Subsequently, an interlayer insulating layer which covers the gate electrode layer and the gate insulating layer is formed. In this embodiment mode, the interlayer insulating layer is a stacked layer of the insulating layer 222 which contains hydrogen and serves as a protection film and the planarization layer 223.

Further, heat treatment is performed in a nitrogen atmosphere at 300 to 550° C. for 1 to 12 hours to hydrogenate the semiconductor layer. Preferably, this heat treatment is performed at 400 to 500° C. This step terminates dangling bonds of the semiconductor layer with hydrogen which is contained in the insulating layer 222, which is the interlayer insulating layer. In this embodiment mode, the heat treatment is performed at 410° C. for one hour. This heat treatment may also serve as the heat treatment for the semiconductor layer 119 and the insulating layer 210.

In the present invention, the planarization layer 223 is formed to relieve projections and depressions on the surface which are generated by the semiconductor layer, the gate electrode layer, and the like and to planarize the surface. Accordingly, the planarization layer 223 is formed to have a thickness with which the surface thereof is planarized. Note that the surface may be planarized by chemical mechanical polishing (CMP).

The gate insulating layer 217, the gate electrode layer 218, the insulating layer 222, and the planarization layer 223 correspond to the gate insulating layer 205, the gate electrode layer 206, the insulating layer 210, and the planarization layer 211, respectively, and they can be formed of similar materials and by similar steps.

Then, contact holes (openings) which reach the semiconductor layer 119 are formed in the gate insulating layer 205, the insulating layer 210, the planarization layer 211, the insulating layer 212, the gate insulating layer 217, the insulating layer 222, and the planarization layer 223 using a mask formed of a resist; and contact holes (openings) which reach the semiconductor layer 216 are formed in the gate insulating layer 217, the insulating layer 222, and the planarization layer 223 using a mask formed of a resist. Etching may be performed once or plural times in accordance with a selectivity of a material which is used. The gate insulating layer 205, the insulating layer 210, the planarization layer 211, the insulating layer 212, the gate insulating layer 217, the insulating layer 222, and the planarization layer 223 are selectively removed by etching to form openings which reach the impurity regions 208a and 208b or the impurity regions 220a and 220b, which are source regions and drain regions.

A method and a condition of the etching may be set as appropriate depending on the materials of the gate insulating layer 205, the insulating layer 210, the planarization layer 211, the insulating layer 212, the gate insulating layer 217, the insulating layer 222, and the planarization layer 223 in which the contact holes are formed. Wet etching, dry etching, or both of them can be used as appropriate. In this embodiment mode, dry etching is used. As an etching gas, a chlorine-based gas typified by $Cl_2$, $BCl_3$, $SiCl_4$ or $CCl_4$; a fluorine-based gas typified by $CF_4$, $SF_6$, or $NF_3$; or $O_2$ can be used as appropriate. Further, an inert gas may be added to an etching gas to be used. As an inert element to be added, one or a plurality of elements selected from He, Ne, Ar, Kr, or Xe can be used.

As an etchant of wet etching, a hydrofluoric acid-based solution such as a mixed solution of ammonium hydrogen fluoride and ammonium fluoride may be used.

A conductive film is formed to cover the openings, and the conductive film is etched to form the wiring layers 224, 225, and 226. The wiring layers 224, 225, and 226 are electrically connected to portions of source regions and drain regions and serve as source electrode layers and drain electrode layers. The wiring layers can be formed by forming a conductive film by a PVD method, a CVD method, an evaporation method, or the like, and then etching the conductive film into a desired shape. Alternatively, the conductive layers can be selectively formed in predetermined positions by a droplet discharge method, a printing method, an electroplating method, or the like. Further, a reflow method or a damascene method may be used. The wiring layers are formed of a metal such as Ag, Au, Cu, Ni, Pt, Pd, Ir, Rh, W, Al, Ta, Mo, Cd, Zn, Fe, Ti, Zr, or Ba; or Si or Ge; or an alloy or nitride thereof. Further, a laminate of those layers may be employed.

Figure 8C:
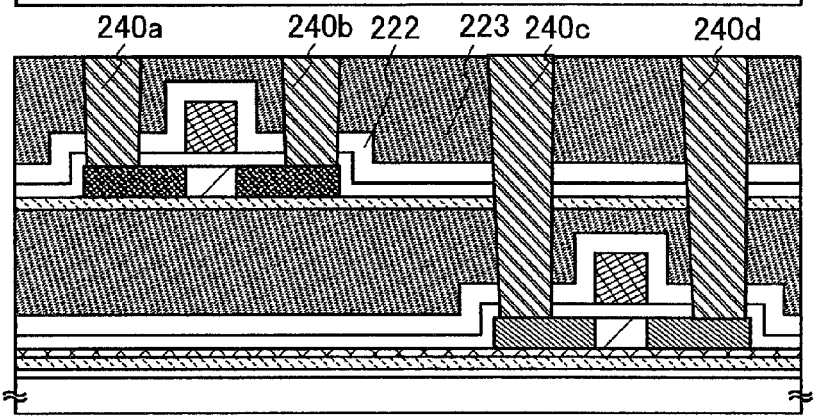

In this embodiment mode, the wiring layers 240a and 240b are formed as embedded wiring layers to fill contact holes formed in the gate insulating layer 217, the insulating layer 222, and the planarization layer 223; and the wiring layers 240c and 240d are formed as embedded wiring layers to fill contact holes formed in the gate insulating layer 205, the insulating layer 210, the planarization layer 211, the insulating layer 212, the gate insulating layer 217, the insulating layer 222, and the planarization layer 223 (see FIG. 8C). The wiring layers 240a, 240b, 240c, and 240d, which are the embedded wiring layers, are formed by forming a conductive film having an enough thickness to fill the contact holes and polishing the conductive film by a CMP method or the like so that the conductive film can remain only in contact hole portions and an unnecessary part of the conductive film are removed.

The wiring layers 241a, 241b, and 241c are formed as lead wiring layers over the wiring layers 240a, 240b, 240c, and 240d, which are the embedded wiring layer, whereby the wiring layers 224, 225, and 226 are formed.

Figure 8D:
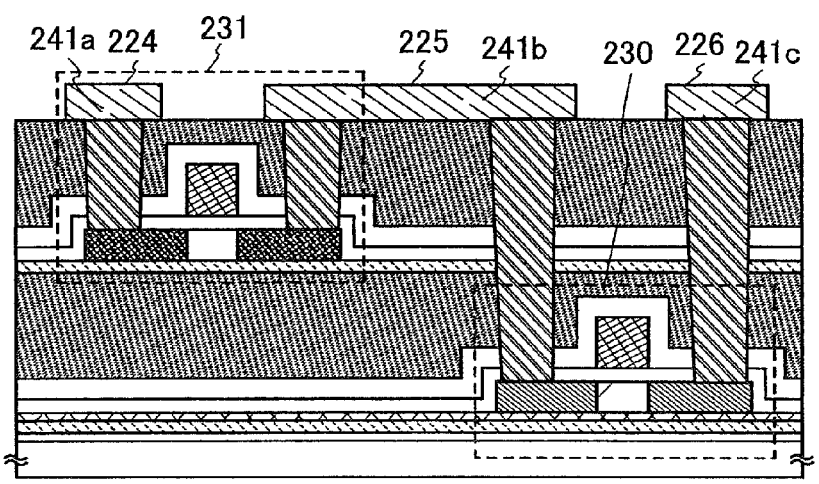

Through the above-described steps, a semiconductor device having a CMOS structure, including the field-effect transistor 230, which is an n-channel field-effect transistor and the field-effect transistor 231, which is a p-channel field-effect transistor can be manufactured (see FIG. 8D). Note that the field-effect transistor 230 and the field-effect transistor 231 are electrically connected by the wiring layer 225.

The field-effect transistor 230 is bonded to the insulating layer 104 and is provided over the supporting substrate 101, while the field-effect transistor 231 is bonded to the insulating layer 212 which is formed over the planarization layer 211 covering the field-effect transistor 230 and is provided over the planarization layer 211. The field-effect transistor 230 and the field-effect transistor 231 are stacked.

According to the present invention, high performance semiconductor elements can be stacked; therefore, higher integration of the semiconductor devices can be achieved.

In addition, in attaching the semiconductor layers to the supporting substrate, the semiconductor layers are formed over different planar insulating layers; therefore, the insulating layers and the semiconductor layers can be easily bonded to each other.

As in this embodiment mode, when field-effect transistors of different conductivity types are formed over different insulating layers, parasitic capacitance between the semiconductor layers of the field-effect transistors of different conductivity types and parasitic capacitance between the gate electrode layers of the field-effect transistors of different conductivity types can be reduced. Accordingly, a high-performance semiconductor device can be manufactured.

The field-effect transistor is not limited to the one described in this embodiment mode, and may have a single gate structure, in which one channel formation region is formed, a double gate structure, in which two channel formation regions are formed, or a triple gate structure, in which three channel formation regions are formed.

In addition, while this embodiment mode describes a CMOS structure in which the field-effect transistors which are stacked have different conductivity types, field-effect transistors of the same conductivity type may be stacked.

As described above, in this embodiment mode, semiconductor devices including more highly integrated and higher performance semiconductor elements can be manufactured.

Embodiment Mode 2

This embodiment mode describes an example in which steps of separating a semiconductor layer from the semiconductor substrate and bonding the semiconductor layer to a supporting substrate are different from steps in Embodiment Mode 1. Repetitive description of the same portion or a portion having a similar function to the portions in Embodiment Mode 1 is omitted.

In this embodiment mode, when a semiconductor layer is transferred from a semiconductor substrate, the semiconductor substrate is selectively etched (this step is also referred to as groove processing) and a plurality of semiconductor layers which are divided to have the size of semiconductor elements to be manufactured are transferred to a supporting substrate. Thus, a plurality of island-shaped semiconductor layers can be formed over the supporting substrate. The semiconductor layers which are processed into an element size in advance are transferred; therefore, the semiconductor layers can be transferred to the supporting substrate in units of the semiconductor layers. Therefore, the size and shape of the semiconductor substrate are not limited. Accordingly, the semiconductor layers can be more efficiently transferred to a large-sized supporting substrate.

The semiconductor layer which is thus formed over the supporting substrate may be etched so that the shape is processed, modified, and controlled precisely. Accordingly, error in a formation position and a defect in the shape of the semiconductor layer due to pattern misalignment caused by light or the like in light exposure for forming a resist mask going around the resist mask, positional misalignment caused by a bonding step in transferring the semiconductor layer, or the like can be modified.

Accordingly, a plurality of semiconductor layers having a desired shape can be formed over the supporting substrate with a high yield. Therefore, a semiconductor device which includes high performance semiconductor elements and an integrated circuit which are more precise can be manufactured over a large-sized substrate with high throughput and high productivity.

Figure 5A:
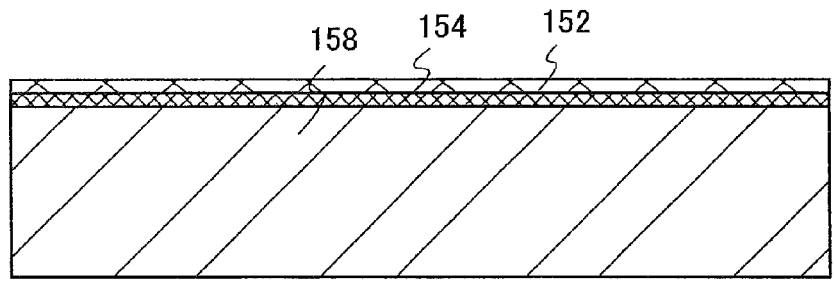
FIGS. 5A to 5E illustrate a method for manufacturing a semiconductor device of the present invention.

FIG. 5A illustrates a state in which a protection layer 154 and a silicon nitride film 152 are formed over a semiconductor substrate 158. The silicon nitride film 152 is used as a hard mask in performing groove processing on the semiconductor substrate 158. The silicon nitride film 152 may be formed by depositing silane and ammonia by a vapor deposition method.

Figure 5B:
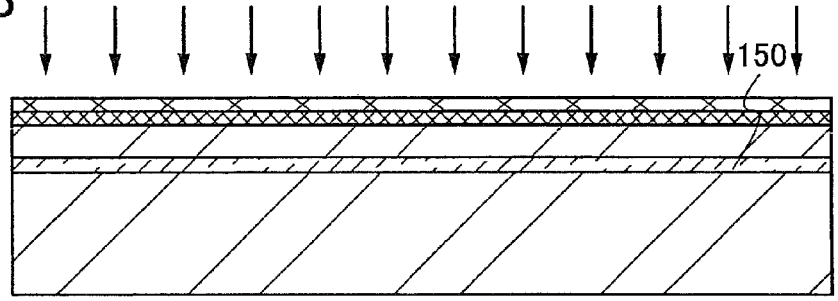

Then, ion irradiation is performed to form a fragile layer 150 in the semiconductor substrate 158 (see FIG. 5B). Ion irradiation is performed in consideration of the thickness of a semiconductor layer which is to be transferred to a supporting substrate. In consideration of the thickness, an accelerating voltage for irradiating the semiconductor substrate 158 with ions is set so that a deep part of the semiconductor substrate 158 is irradiated. With this treatment, the fragile layer 150 is formed in a region at a certain depth from the surface of the semiconductor substrate 158.

The groove processing is performed in consideration of the shape of semiconductor layers of semiconductor elements. That is, in order to transfer a semiconductor layer of a semiconductor element to the supporting substrate, the groove processing is performed on the semiconductor substrate 158 such that a portion which is transferred as a semiconductor layer remains as a convex portion.

Figure 5C:
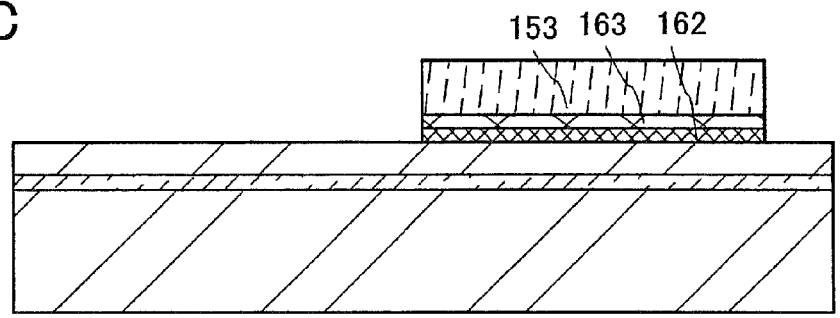

A mask 153 is formed of photoresist. The silicon nitride film 152 and the protection layer 154 are etched using the mask 153 to form a protection layer 162 and a silicon nitride layer 163 (see FIG. 5C).

Figure 5D:
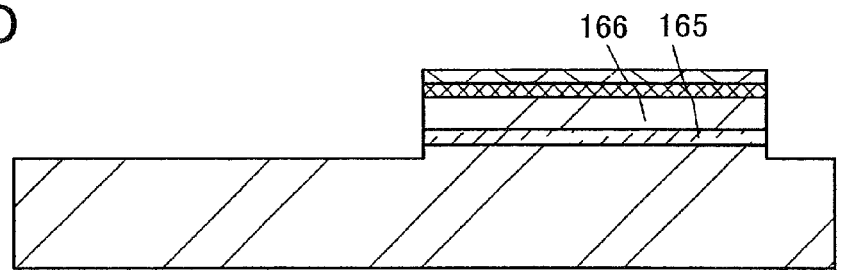

Then, the semiconductor substrate 158 is etched using the silicon nitride layer 163 as a hard mask to form the semiconductor substrate 158 having a fragile layer 165 and a semiconductor layer 166 (see FIG. 5D). In the present invention, a semiconductor region which is part of a semiconductor substrate which is processed into a convex shape using a fragile layer and by groove processing is referred to as the semiconductor layer 166 as in FIG. 5D.

The depth of etching the semiconductor substrate 158 is set as appropriate in consideration of the thickness of the semiconductor layer which is transferred to the supporting substrate. The thickness of the semiconductor layer can be set by a depth where hydrogen ions reach by irradiation. The groove formed in the semiconductor substrate 158 is preferably deeper than the fragile layer. In this groove processing, if the groove is processed to be deeper than the fragile layer, the fragile layer can be left only in a region of the semiconductor layer which is to be released.

Figure 5E:
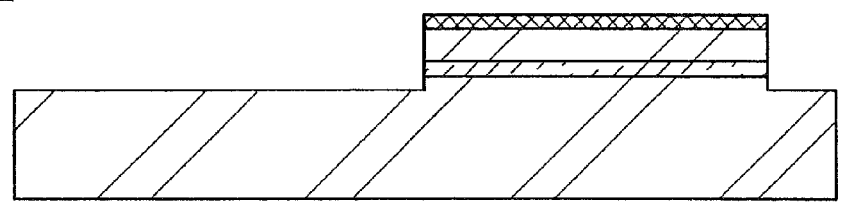
Figure 6A:
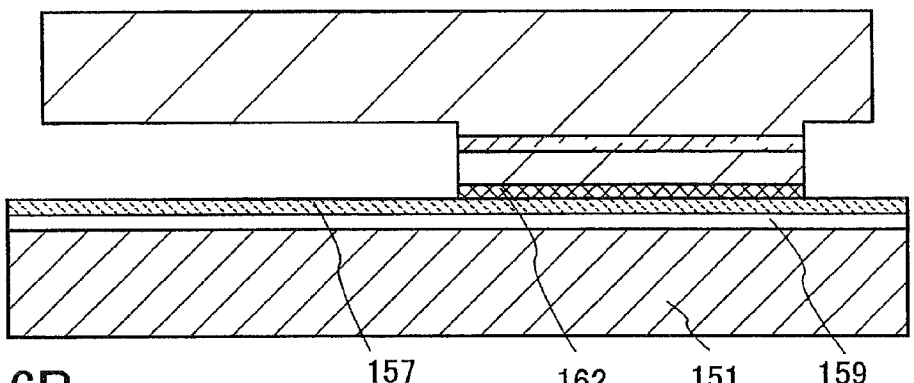
FIGS. 6A to 6D illustrate a method for manufacturing a semiconductor device of the present invention.

The silicon nitride layer 163 on the surface is removed (see FIG. 5E). Then, the surface of the protection layer 162 of the semiconductor substrate 158 and the supporting substrate 151 are bonded to each other (see FIG. 6A).

The surface of the supporting substrate 151 is provided with a blocking layer 159 and an insulating layer 157. The blocking layer 159 is provided so as to prevent impurities such as sodium ions from diffusing from the supporting substrate 151 and contaminating the semiconductor layer. Note that in a case where there is no possibility of diffusion of impurities from the supporting substrate 151 which causes adverse effects on the semiconductor layer, the blocking layer 159 can be omitted. The insulating layer 157 is provided to form a bond with the protection layer 162.

The bond can be formed by disposing the protection layer 162 of the semiconductor substrate 158 and the insulating layer 157 of the supporting substrate, the surfaces of which are cleaned, in close contact with each other. The bond can be formed at room temperature. This bonding is performed at the atomic level, and a strong bond is formed at room temperature by van der Waals forces. Since groove processing has been performed on the semiconductor substrate 158, a convex portion forming the semiconductor layer is in contact with the supporting substrate 151.

Figure 6B:
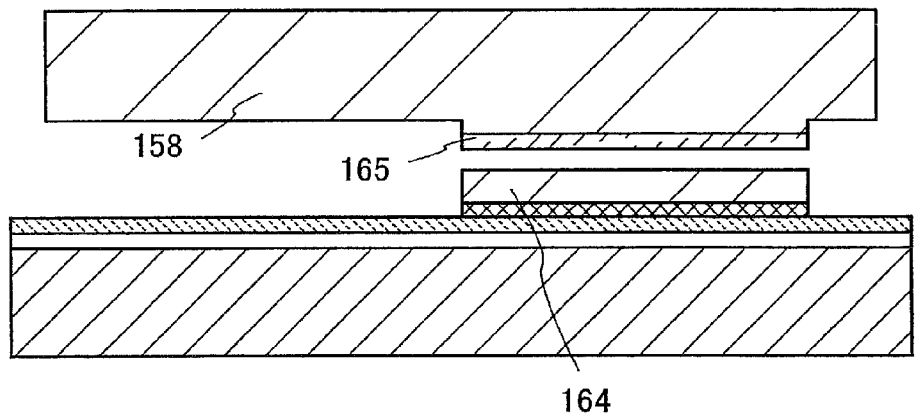

After the bond between the semiconductor substrate 158 and the supporting substrate 151 is formed, heat treatment is performed to release a semiconductor layer 164 from the semiconductor substrate 158 and to fasten the semiconductor layer 164 to the supporting substrate 151, as illustrated in FIG. 6B. The volume of microvoids formed in the fragile layer 150 is changed and a crack is generated along the fragile layer 150, whereby the semiconductor layer is released. After that, in order to further strengthen the bond, heat treatment is preferably performed. As described above, the semiconductor layer is formed over the insulating surface. FIG. 6B illustrates a state in which the semiconductor layer 164 is bonded to the supporting substrate 151.

In this embodiment mode, since the semiconductor layers which are processed into an element size in advance are transferred, transfer to the supporting substrate can be performed in units of the semiconductor layers; therefore, the size and shape of the semiconductor substrate are not limited. Accordingly, semiconductor layers having various shapes can be formed over the semiconductor substrate. For example, the shapes of the semiconductor layers can be freely formed in accordance with a mask of a light-exposure apparatus which is used for etching, a stepper of the light-exposure apparatus for forming a mask pattern, and a panel or chip size of a semiconductor device which is cut from a large-sized substrate.

The semiconductor layer 164 may be used as it is as a semiconductor layer of a semiconductor element, or may be etched to process the shape.

Figure 6C:
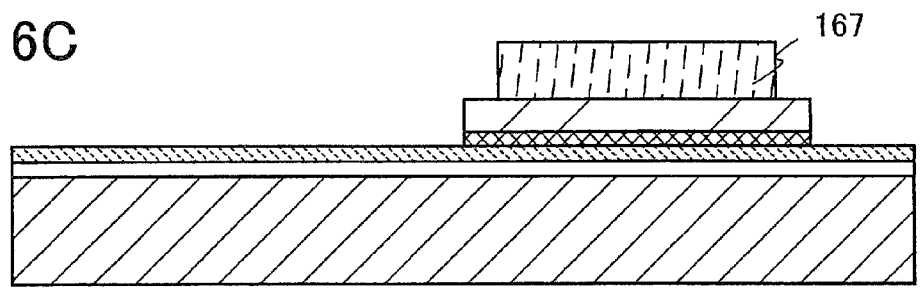
Figure 6D:
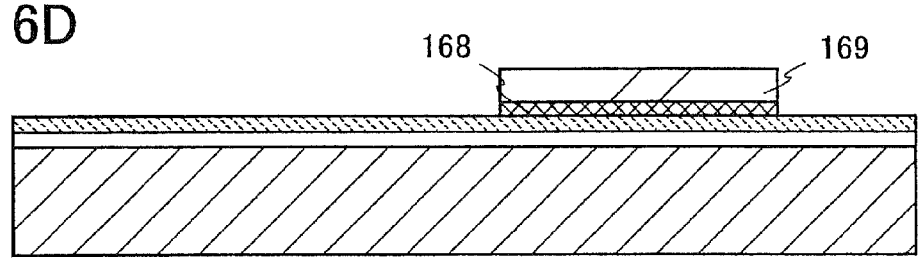

FIGS. 6C and 6D illustrate an example in which the semiconductor layer 164 which is transferred is further etched to have the shape processed. A mask 167 is formed to expose a periphery of the semiconductor layer 164, which is an unnecessary part.

The semiconductor layer 164 is etched using the mask 167 to form a semiconductor layer 169. In this embodiment mode, the protection layer 162 under the semiconductor layer is etched together with the semiconductor layer to be a protection layer 168 (see FIG. 6D). As described above, when the shape of the semiconductor layer is further processed after the semiconductor layer is transferred to the supporting substrate, misalignment of a region where the semiconductor layer is formed, defects in shape, or the like which occur in the manufacturing process can be modified.

FIGS. 5A to 5E and FIGS. 6A to 6D illustrate an example in which a semiconductor layer is transferred to an insulating layer over the supporting substrate. Needless to say, this embodiment mode can be employed for forming a semiconductor layer over an insulating layer which is over a planarization layer, as a semiconductor layer for a semiconductor element which is in the upper layer.

This embodiment mode can be implemented in combination with Embodiment Mode 1 as appropriate.

Embodiment Mode 3

This embodiment mode describes an example in which steps of separating a semiconductor layer from the semiconductor substrate and bonding the semiconductor layer to a supporting substrate are different from steps in Embodiment Mode 1. Repetitive description of the same portion or a portion having a similar function to the portions in Embodiment Mode 1 is omitted.

This embodiment mode describes an example in which after a semiconductor layer is separated from a semiconductor substrate, the semiconductor layer is bonded to a supporting substrate.

Figure 15A:
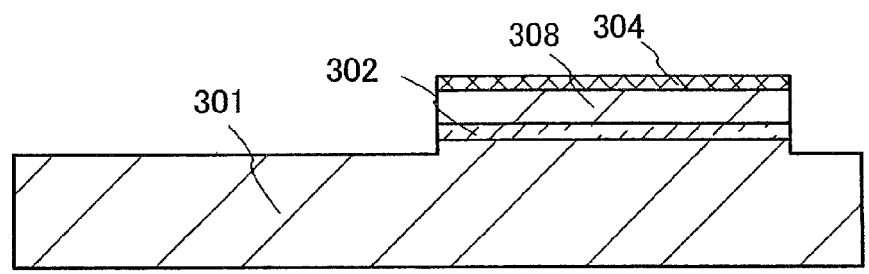
FIGS. 15A to 15D illustrate a method for manufacturing a semiconductor device of the present invention.

As described in Embodiment Mode 2 with reference to FIGS. 5A to 5E, the fragile layer is formed in the semiconductor substrate and a groove is formed. Groove processing is performed in consideration of the shape of a semiconductor layer of a semiconductor element. That is, in order to transfer the semiconductor layer of the semiconductor element to the supporting substrate, the groove processing is performed on a semiconductor substrate 301 such that a portion which is transferred as the semiconductor layer remains as a convex portion. In FIG. 15A, the semiconductor substrate 301, a fragile layer 302, a semiconductor layer 308 which is part of the semiconductor substrate 301, and an insulating film 304 are formed. In this embodiment mode, silicon oxide is used for the insulating film 304.

Then, heat treatment is performed and neighboring minute voids in the fragile layer 302 are coupled and the volume of the minute voids is increased. As a result, the semiconductor substrate 301 is cleaved along the fragile layer 302; thus, the semiconductor layer 308 is released with the insulating film 304 from the semiconductor substrate 301. The heat treatment may be performed in a temperature range of 400 to 600° C.

Note that heat treatment may be performed using dielectric heating with a high frequency wave such as a microwave. The heat treatment using dielectric heating can be performed by irradiating the semiconductor substrate 301 with a high-frequency wave with a frequency of 300 MHz to 3 THz which is produced with a high-frequency generator. Specifically, for example, irradiation is performed with a microwave of 2.45 GHz at 900 W for 14 minutes to couple the neighboring minute voids in the fragile layer; thus, the semiconductor substrate 301 is finally cleaved.

Figure 15B:
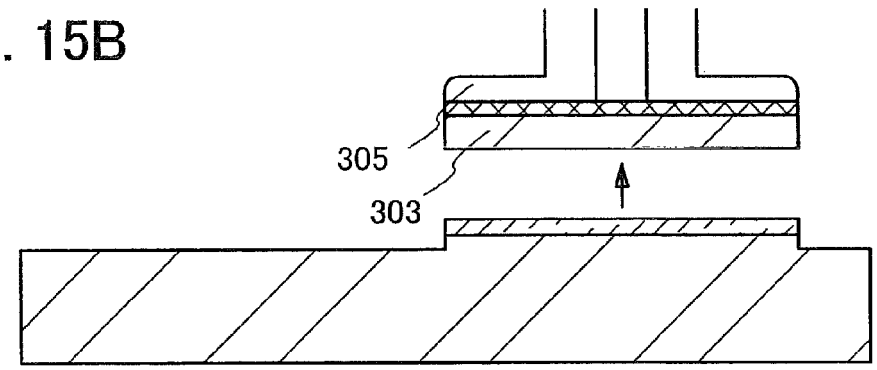

Then, as shown in FIG. 15B, a collet 305 is fixed to the insulating film 304 formed over the semiconductor layer 308, and the semiconductor layer 308 is pulled apart from the semiconductor substrate 301. Even if cleavage of the semiconductor substrate 301 by the above-described heat treatment is incomplete, the semiconductor layer 308 is completely released from the semiconductor substrate 301 and a semiconductor layer 303 can be obtained by applying force to the collet 305. The collet 305 can be a means that can be selectively fixed to one of the semiconductor layers 308, such as a chuck like a vacuum chuck or a mechanical chuck, a microneedle with an adhesive attached to a tip, or the like. FIG. 15B illustrates a case where a vacuum chuck is used as the collet 305.

As the adhesive which is attached to the microneedle, an epoxy-based adhesive, a ceramic-based adhesive, a silicone-based adhesive, a low temperature coagulant, or the like can be used. As the low temperature coagulant, for example, MW-1 (manufactured by Eminent Supply Corporation) can be used. MW-1 has a freezing point of 17° C. and has an adhesive effect at a temperature of 17° C. or lower (preferably at 10° C. or lower) and does not have an adhesive effect at a temperature of 17° C. or higher (preferably approximately 25° C.).

Note that hydrogenation may be performed on the semiconductor substrate 301 before the cleavage of the semiconductor substrate 301. Hydrogenation is performed, for example, at 350° C. in a hydrogen atmosphere for approximately two hours.

Figure 15C:
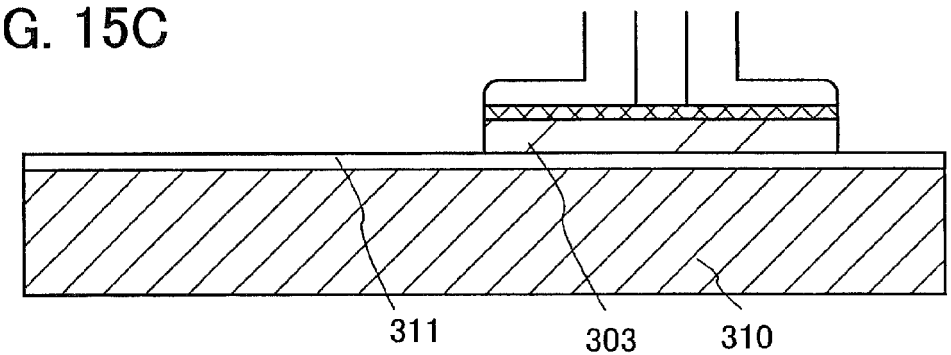

Next, as shown in FIG. 15C, the semiconductor layer 303 and a supporting substrate 310 are attached to each other so that a surface exposed by releasing the semiconductor layer 303 faces the supporting substrate 310. In this embodiment mode, because an insulating film 311 is formed over the supporting substrate 310, the semiconductor layer 303 and the supporting substrate 310 can be attached to each other by bonding the insulating film 311 and the semiconductor layer 303. After bonding the semiconductor layer 303 and the insulating film 311, heat treatment at 400 to 600° C. is preferably performed in order to further strengthen the bond.

The bond is formed by van der Waals forces; therefore, a strong bond can be formed even at room temperature. Note that since the above-described bonding can be performed at a low temperature, various substrates can be used as the supporting substrate 310. For example, as the supporting substrate 310, a substrate such as a quartz substrate or a sapphire substrate can be used as well as a glass substrate made of aluminosilicate glass, barium borosilicate glass, aluminoborosilicate glass, or the like. Further, as the supporting substrate 310, a semiconductor substrate formed of silicon, gallium arsenide, indium phosphide, or the like can be used. Alternatively, a metal substrate such as a stainless steel substrate may be used as the supporting substrate 310.

Note that the supporting substrate 310 does not necessarily have the insulating film 311 on its surface. In the case where the insulating film 311 is not formed, the supporting substrate 310 and the semiconductor layer 303 can be bonded to each other. Note that by formation of the insulating film 311 on the surface of the supporting substrate 310, impurities such as an alkali metal or an alkaline-earth metal can be prevented from entering the semiconductor layer 303 from the supporting substrate 310.

If the insulating film 311 is formed, not the supporting substrate 310 but the insulating film 311 is bonded to the semiconductor layer 303; therefore, kinds of substrates which can be used as the supporting substrate 310 are further increased. A substrate formed from a flexible synthetic resin such as plastic generally tends to have a low upper temperature limit, but can be used as the supporting substrate 310 in the case where the insulating film 311 is formed, as long as the substrate can withstand processing temperatures of the manufacturing process.

Note that before or after the semiconductor layer 303 is attached to the supporting substrate 310, thermal annealing using irradiation with laser light may be performed on a surface exposed by release of the semiconductor layer 303. If thermal annealing is performed before the semiconductor layer 303 is attached to the supporting substrate 310, the surface exposed by release is planarized and bonding strength can be further increased. If thermal annealing is performed after the semiconductor layer 303 is attached to the supporting substrate 310, part of the semiconductor layer 303 is melted and bonding strength can be further increased.

Note that the semiconductor layer 303 may be attached to the supporting substrate 310 not only by the bond but also by application of high frequency oscillation of approximately 10 MHz to 1 THz to the semiconductor layer 303, which generates frictional heat between the semiconductor layer 303 and the supporting substrate 310 to melt part of the semiconductor layer 303 with the heat, whereby the semiconductor layer 303 is attached to the supporting substrate 310.

Note that when MW-1 is used as a low temperature coagulant, first, the low temperature coagulant which is attached to the tip of a microneedle is made in contact with the insulating film 304 at a temperature (e.g., approximately 25° C.) at which the low temperature coagulant does not have an adhesive effect. Next, a temperature is lowered to a temperature (e.g., approximately 5° C.) at which the low temperature coagulant has an adhesive effect and the low temperature coagulant is solidified, whereby the microneedle and the insulating film 304 are fixed. After the semiconductor layer 303 pulled apart from the semiconductor substrate 301 is attached to the supporting substrate 310, the temperature of the low temperature coagulant is raised to a temperature (e.g., approximately 25° C.) at which the low temperature coagulant does not have an adhesive effect again, whereby the microneedle can be pulled apart from the semiconductor layer 303.

Figure 15D:
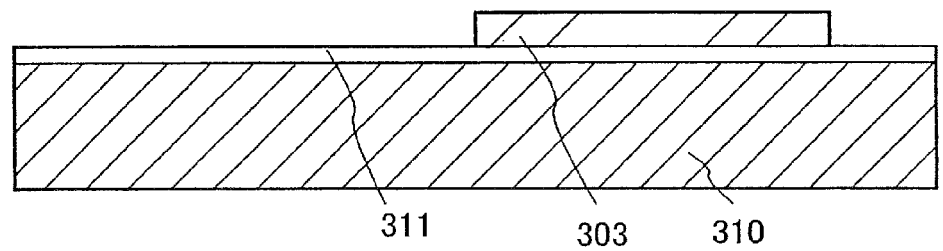

The insulating film 304 over the semiconductor layer 303 is removed, and the semiconductor layer 303 having an island shape is formed over the supporting substrate 310 and the insulating film 311 (see FIG. 15D). The semiconductor layer 303 may be further etched to have the shape processed.

When the surface of the semiconductor layer which is exposed by the cleavage faces the supporting substrate as illustrated in FIGS. 15A to 15D, a surface with higher planarity is in contact with a gate insulating film; therefore, the interface state density between the semiconductor layer and the gate insulating film can be low and uniform. Accordingly, polishing for planarizing the surface of the semiconductor layer which comes into contact with the gate insulating film can be omitted, or a polishing time can be shortened, whereby cost can be suppressed and throughput can be improved.

Note that the semiconductor layer can be attached to the supporting substrate so that the surface of the semiconductor layer exposed by the cleavage comes into contact with the gate insulating film. This example is described with reference to FIGS. 16A to 16D and FIGS. 17A to 17C.

Figure 16A:
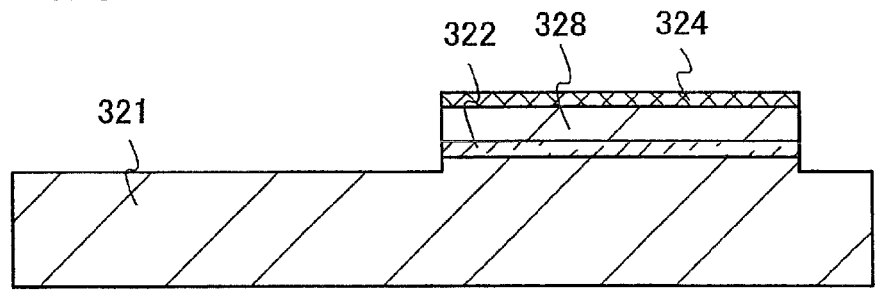
FIGS. 16A to 16D illustrate a method for manufacturing a semiconductor device of the present invention.

In FIG. 16A, a semiconductor substrate 321, a fragile layer 322, a semiconductor layer 328 which is part of the semiconductor substrate, and an insulating film 324 are formed as in FIG. 15A. In this embodiment mode, silicon oxide is used for the insulating film 324.

Figure 16B:
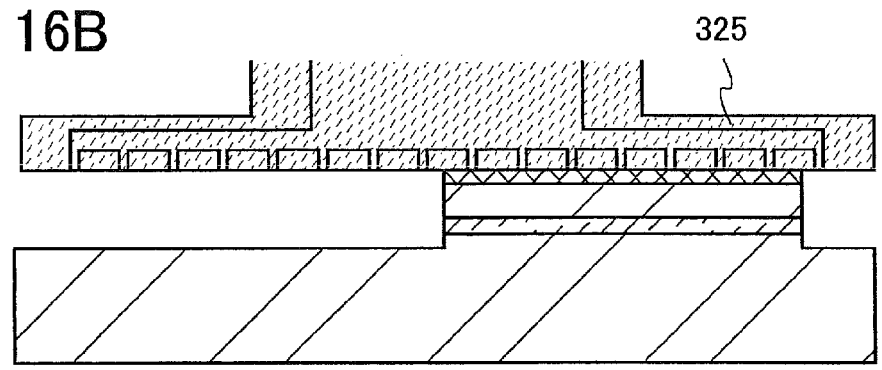

Next, as shown in FIG. 16B, the semiconductor substrate 321 is fixed to a holding means 325. The semiconductor substrate 321 is fixed so that the semiconductor layer 328 faces the holding means 325. The holding means 325 can be a large-sized vacuum chuck or mechanical chuck which can withstand heat treatment in a later step and be fixed so as to be overlapped with a plurality of semiconductor layers (in FIGS. 16A to 16D, the semiconductor layer 328). In specific, the holding means 325 can be a porous vacuum chuck, a noncontact vacuum chuck, or the like. This embodiment mode describes an example in which a vacuum chuck is used as the holding means 325.

Figure 16C:
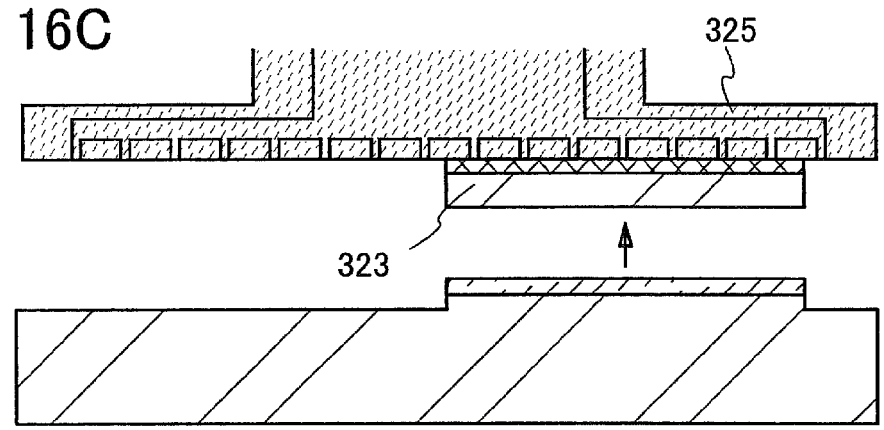

Then, heat treatment is performed and neighboring minute voids in the fragile layer 322 are coupled and the volume of the minute voids is increased. As a result, the semiconductor substrate 321 is cleaved along the fragile layer 322 as illustrated in FIG. 16C; thus, the semiconductor layer 328, which has been part of the semiconductor substrate 321, becomes the semiconductor layer 323 and is released with the insulating film 324 from the semiconductor substrate 321. The heat treatment may be performed in a temperature range of 400 to 600° C.

Note that heat treatment may be performed using dielectric heating with a high frequency wave such as a microwave.

Note that hydrogenation may be performed on the semiconductor substrate 321 before the cleavage of the semiconductor substrate 321.

Figure 16D:
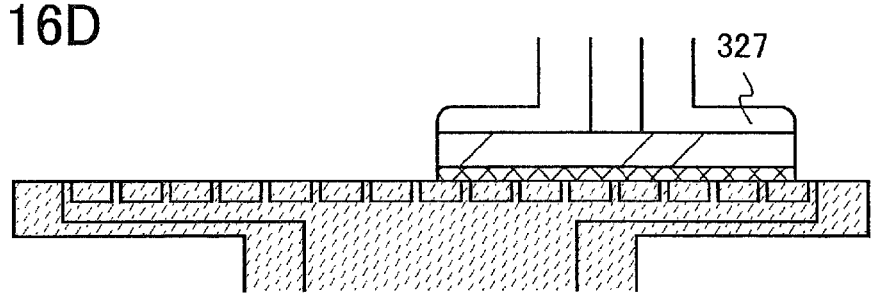
Figure 17A:
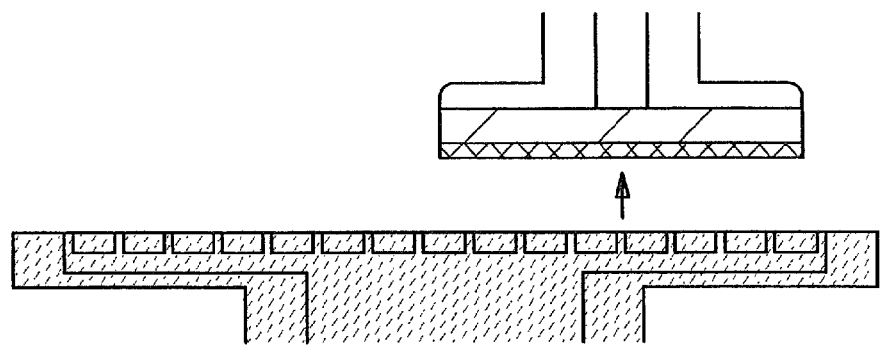
FIGS. 17A to 17C illustrate a method for manufacturing a semiconductor device of the present invention.

Then, as shown in FIG. 16D and FIG. 17A, a collet 327 is fixed to the surface of the semiconductor layer 323 which is exposed by the cleavage, and the semiconductor layer 323 is pulled apart from the holding means 325. The collet 327 can be a means that can be selectively fixed to the semiconductor layer 323, such as a chuck like a vacuum chuck or a mechanical chuck, a microneedle with an adhesive attached to a tip, or the like. FIG. 16D and FIG. 17A illustrate a case where a vacuum chuck is used as the collet 327.

Although this embodiment mode describes an example in which the collet 327 is fixed to the surface of the semiconductor layer 323 which is exposed by the cleavage, a protection film such as an insulating film may be formed in order to prevent the semiconductor layer 323 from being damaged by the collet 327. Note that the protection film is removed after the semiconductor layer 323 is attached to the supporting substrate 330 in a later step.

As the adhesive which is attached to the microneedle, an epoxy-based adhesive, a ceramic-based adhesive, a silicone-based adhesive, a low temperature coagulant, or the like can be used.

Figure 17B:
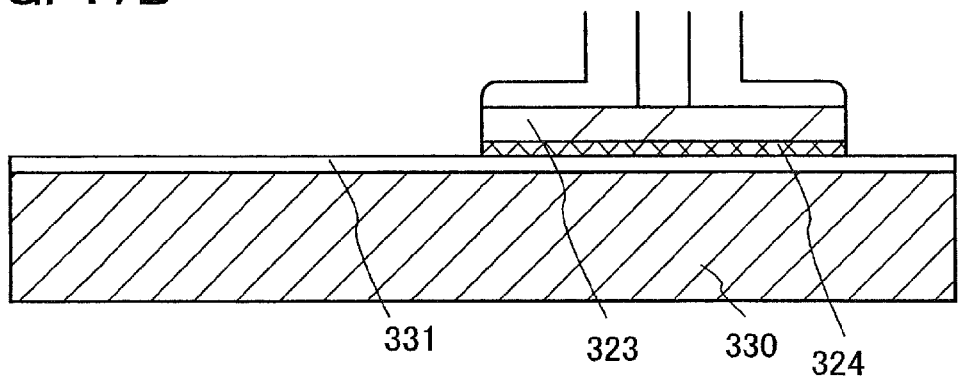
Figure 17C:
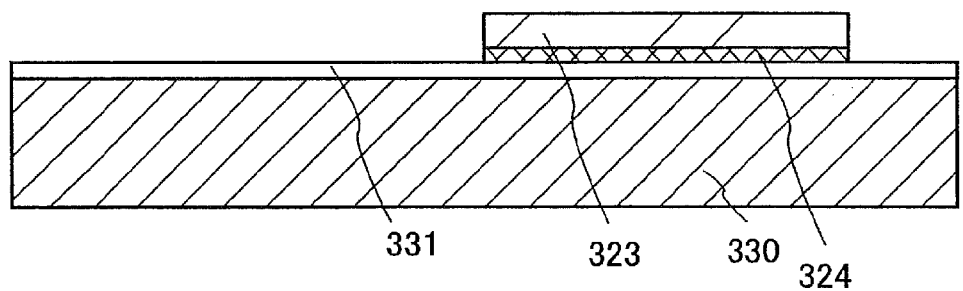

Next, as shown in FIG. 17B, the semiconductor layer 323 and the supporting substrate 330 are attached to each other so that the insulating film 324 faces the supporting substrate 330, in other words, a surface opposite to the surface exposed by the cleavage faces the supporting substrate 330. In this embodiment mode, because an insulating film 331 is formed over the supporting substrate 330, the semiconductor layer 323 and the supporting substrate 330 can be attached to each other by bonding the insulating film 324 and the insulating film 331 (see FIG. 17C). After bonding the insulating film 331 and the insulating film 324, heat treatment at 400 to 600° C. is preferably performed in order to further strengthen the bond.

The bond is formed by van der Waals forces, so that a strong bond can be formed even at room temperature. Note that since the above-described bonding can be performed at a low temperature, various substrates can be used as the supporting substrate 330.

Note that the supporting substrate 330 does not necessarily have the insulating film 331 on its surface.

Note that there are a case where the semiconductor substrate is warped or deformed and a case where an end portion of the semiconductor substrate is slightly rounded. Further, when the semiconductor substrate is irradiated with hydrogen or a noble gas, or hydrogen ions or noble gas ions to release a semiconductor layer from the semiconductor substrate, there is a case where irradiation with the above-mentioned gas or ions is not sufficiently performed on the end portion of the semiconductor substrate. Therefore, it is difficult to release a portion of the semiconductor layer which is at an end portion of the semiconductor substrate, and in the case where the semiconductor substrate is attached to a supporting substrate, and then is separated to form the semiconductor layer by cleavage of the semiconductor substrate, the distance between the semiconductor layers may be several millimeter to several centimeters. However, in this embodiment mode, the semiconductor substrate is cleaved to form the semiconductor layer before the semiconductor substrate is attached to the supporting substrate. Thus, when the semiconductor layers are attached to the supporting substrate, the distance between the semiconductor layers can be suppressed as small as about several tens of micrometers, and it is easy to form a semiconductor device using adjacent semiconductor layers.

In a method for manufacturing a semiconductor device of this embodiment mode, since a plurality of semiconductor layers can be attached to one supporting substrate using a plurality of semiconductor substrates, processing can be performed with high throughput. In addition, a crystal plane orientation of the semiconductor layer can be selected as appropriate in accordance with the polarity of a semiconductor element; therefore, the mobility of the semiconductor element can be increased and a semiconductor device that can operate at higher speed can be provided.

In addition, a plurality of semiconductor layers can be formed by cleavage at plural portions of a semiconductor substrate and the plurality of semiconductor layers can be attached to a supporting substrate. Therefore, positions to which the plurality of semiconductor layers are attached can be selected in accordance with polarity and layout of semiconductor elements in a semiconductor device.

This embodiment mode can be implemented in combination with Embodiment Mode 1 as appropriate.

Embodiment Mode 4

This embodiment mode describes a structure of a manufacturing apparatus of a semiconductor device which can be applied to the present invention (in particular, to Embodiment Mode 3).

Figure 18A:
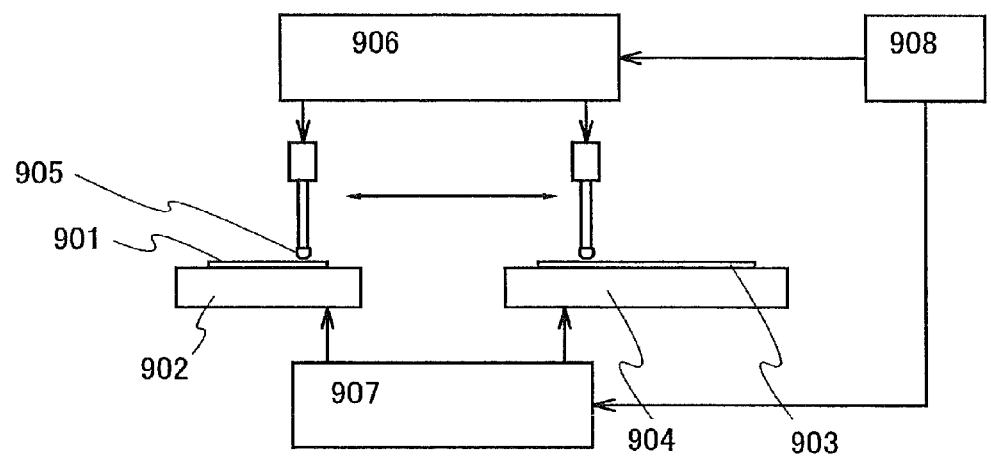
FIGS. 18A and 18B illustrate manufacturing apparatuses of a semiconductor device which can be applied to the present invention.

FIG. 18A illustrates an example of a structure of a manufacturing apparatus which can be applied to the present invention (in particular, to Embodiment Mode 3). The manufacturing apparatus shown in FIG. 18A includes a stage 902 over which a semiconductor substrate 901 is placed and a stage 904 over which a supporting substrate 903 is placed. Note that while FIG. 18A illustrates an example in which the semiconductor substrate 901 and the supporting substrate 903 are placed over different stages, the present invention is not limited to this structure. The semiconductor substrate 901 and the supporting substrate 903 can be placed over one stage.

Further, while FIG. 18A illustrates one stage 902 over which one semiconductor substrate 901 is placed, the present invention is not limited to this structure. For example, a manufacturing apparatus which can be applied to the present invention may have a plurality of stages 902 over which one semiconductor substrate 901 is placed. Alternatively, a plurality of the semiconductor substrates 901 may be placed over the stage 902.

The manufacturing apparatus illustrated in FIG. 18A has a collet 905 which is fixed to a semiconductor layer formed by cleavage of the semiconductor substrate 901 and attaches the semiconductor layer to a predetermined position of the supporting substrate 903. The collet 905 can be a means that can be selectively fixed to one of the semiconductor layers, such as a chuck like a vacuum chuck or a mechanical chuck, a microneedle with an adhesive attached to its tip, or the like.

In addition, the manufacturing apparatus illustrated in FIG. 18A has at least a collet driving portion 906 that controls the position of the collet 905, a stage driving portion 907 that controls positions of the stage 902 and the stage 904, and a CPU 908 which controls operations of the collet driving portion 906 and the stage driving portion 907 in accordance with positional information of the collet or positional information of the stage.

The positional information of the collet or the positional information of the stage can be obtained based on positional information where a semiconductor layer is in the semiconductor substrate 901 and where the semiconductor layer is to be attached to the supporting substrate 903. Note that the manufacturing apparatus illustrated in FIG. 18A may be provided with a camera having an imaging device such as a charge coupled device (CCD) in order to position the semiconductor substrate 901 or the supporting substrate 903.

When a heat sink for absorbing and dissipating heat of the semiconductor substrate 901 is provided over the stage 902 and a microneedle whose tip is provided with a low temperature coagulant is provided as the collet 905, the temperature of the semiconductor substrate 901 can be lowered efficiently by the heat sink.

Figure 18B:
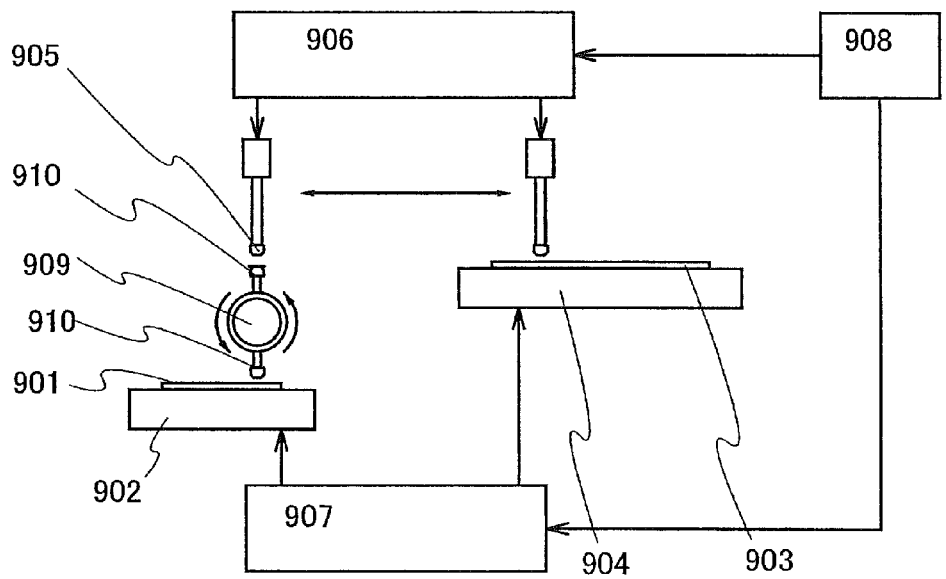

Further, a manufacturing apparatus which can be applied to the present invention may have a reversing device for picking up a semiconductor layer from the semiconductor substrate 901 and then turning over the semiconductor layer. FIG. 18B illustrates a mode in which a reversing device 909 is added to the manufacturing apparatus in FIG. 18A. The reversing device 909 has a reversing collet 910 and can pick up a semiconductor layer and hold it temporarily with the reversing collet 910. The collet 905 can receive the semiconductor layer from the reversing collet 910 by being fixed to a surface of the semiconductor layer which is opposite from the surface fixed to the reversing collet 910.

Figure 19:
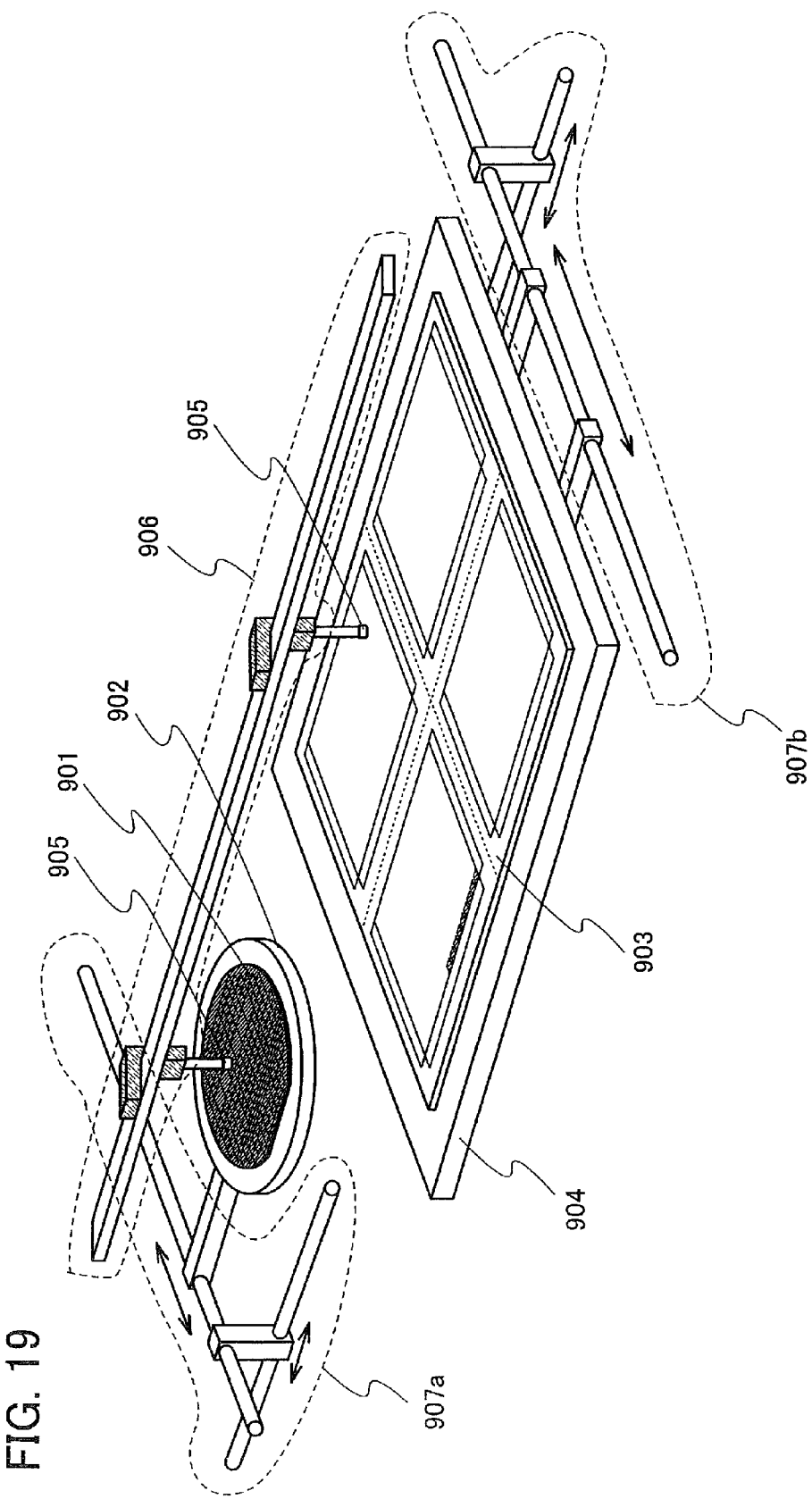
FIG. 19 illustrates a manufacturing apparatus of a semiconductor device which can be applied to the present invention.

Next, in order to illustrate a positional relationship and specific structures of the semiconductor substrate 901, the stage 902, the supporting substrate 903, the stage 904, the collet 905, the collet driving portion 906, and the stage driving portion 907 in FIG. 18A, a perspective view of them is illustrated in FIG. 19. Note that FIG. 19 illustrates an example which employs a stage driving portion 907a which controls the operation of the stage 902 and a stage driving portion 907b which controls the operation of the stage 904.

In accordance with instructions from the CPU 908, the stage driving portion 907a moves the stage 902 in the X direction or the Y direction intersecting the X direction. Note that the stage driving portion 907a may move the stage 902 in the Z direction as well as the X direction or the Y direction. The Z direction exists on a plane different from the plane formed by the X direction and the Y direction. Similarly, the stage driving portion 907b moves the stage 904 in the X direction or the Y direction intersecting the X direction. The stage driving portion 907b may move the stage 904 in the Z direction as well as the X direction or the Y direction. The Z direction exists on a plane different from the plane formed by the X direction and the Y direction.

The collet 905 picks up one of a plurality of semiconductor layers formed by cleavage of the semiconductor substrate 901. Then, the collet driving portion 906 transfers the collet 905 from the semiconductor substrate 901 to the supporting substrate 903, while the collet 905 holds the semiconductor layer. Note that although FIG. 19 illustrates an example in which one collet 905 comes and goes between the semiconductor substrate 901 and the supporting substrate 903, a plurality of collets 905 may be employed. When the plurality of collets 905 are employed, a plurality of collet driving portions 906 for independently controlling the operation of each collet 905 may be prepared, or all the collets 905 may be controlled with one collet driving portion 906.

Figure 20:
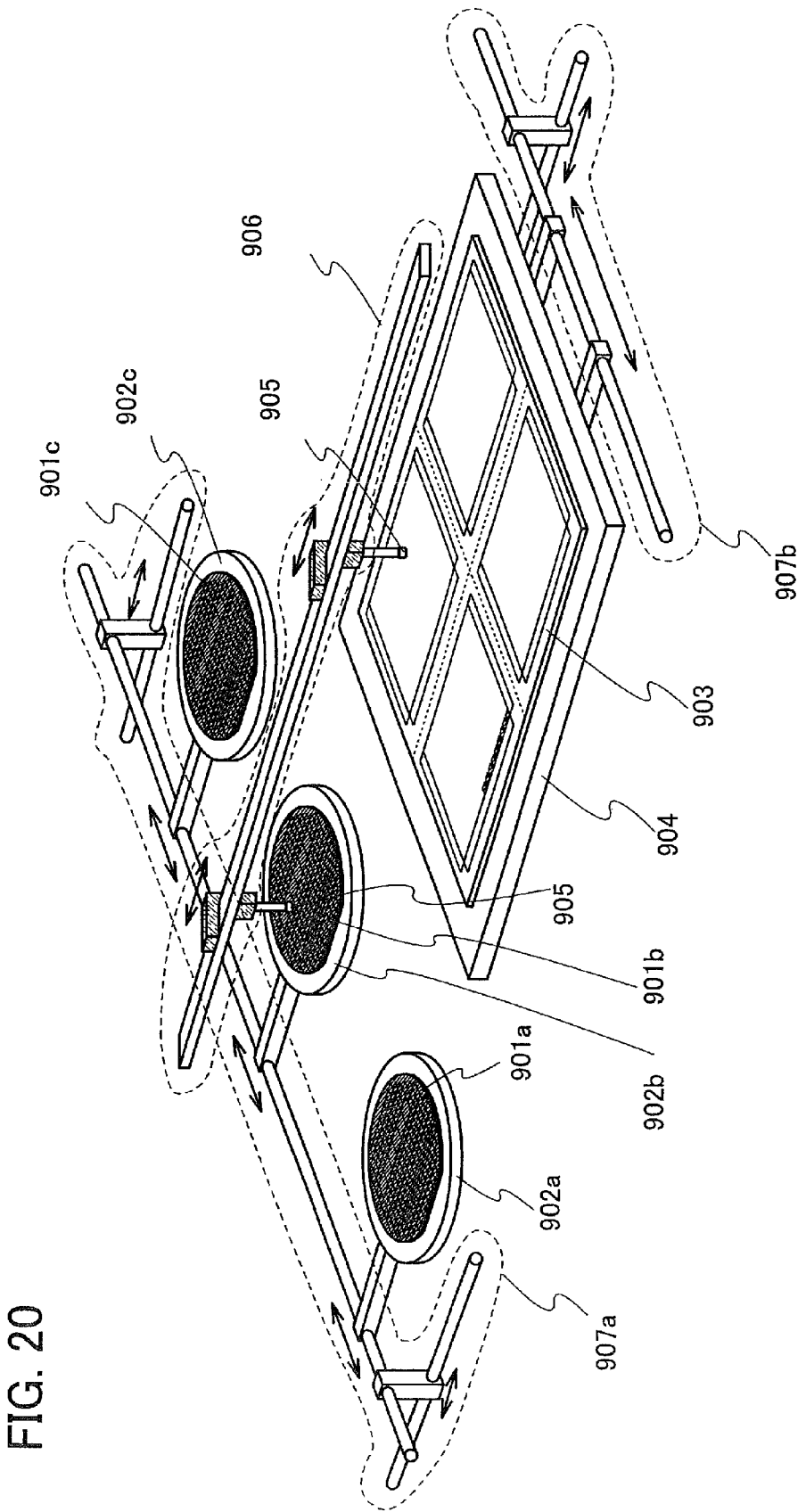
FIG. 20 illustrates a manufacturing apparatus of a semiconductor device which can be applied to the present invention.

Next, FIG. 20 illustrates a mode in which the plurality of stages 902 are employed in FIG. 19. FIG. 20 illustrates an example in which a stage 902a, a stage 902b, and a stage 902c are employed, and all of the stage 902a, the stage 902b, and the stage 902c are controlled by the stage driving portion 907a. Note that a plurality of stage driving portions 907a may be prepared in order to independently control the operation of the stage 902a, the stage 902b, and the stage 902c.

FIG. 20 illustrates a state in which a semiconductor substrate 901a, a semiconductor substrate 901b, and a semiconductor substrate 901c are placed over the stage 902a, the stage 902b, and the stage 902c, respectively. The crystal plane orientations of the semiconductor substrate 901a, the semiconductor substrate 901b, and the semiconductor substrate 901c may be the same or different.

In FIG. 20, the collet 905 picks up one of a plurality of semiconductor layers formed by cleavage of the semiconductor substrate 901a, the semiconductor substrate 901b, and the semiconductor substrate 901c. The collet driving portion 906 transfers the collet 905 from the semiconductor substrate 901a, the semiconductor substrate 901b, or the semiconductor substrate 901c to the supporting substrate 903 while the collet 905 holds the semiconductor layer. Note that although FIG. 20 illustrates an example in which one collet 905 comes and goes between the semiconductor substrate 901a, the semiconductor substrate 901b, and the semiconductor substrate 901c, and the supporting substrate 903; a plurality of collets 905 may be employed so that at least one collet 905 is employed for each of the semiconductor substrate 901a, the semiconductor substrate 901b, and the semiconductor substrate 901c.

The manufacturing apparatus which can be applied to the present invention can transfer and attach a plurality of semiconductor layers formed by one semiconductor substrate 901 to desired positions over the supporting substrate 903 as appropriate.

This embodiment can be implemented in combination with Embodiment Mode 3 as appropriate.

Embodiment Mode 5

This embodiment mode describes a structure in which a semiconductor layer suitable for an n-channel field-effect transistor and a semiconductor layer suitable for a p-channel field-effect transistor are taken out from a semiconductor substrate.

As described in Embodiment Modes 1 to 4, since a semiconductor layer which is separated and transferred from a semiconductor substrate is used for a semiconductor device according to the present invention, a crystal plane orientation of the semiconductor layer can be selected by selecting an appropriate semiconductor substrate. Therefore, a semiconductor layer having a crystal plane orientation which is most suitable for the conductivity type of a field-effect transistor can be selected for each of an n-channel field-effect transistor and a p-channel field-effect transistor.

In the case of bonding semiconductor layers having different crystal plane orientation to a supporting substrate, crystal axes of channel length directions of the semiconductor layers are set in certain directions. Carrier mobility of electrons and holes flowing through a semiconductor layer of a field-effect transistor can be increased by matching anisotropy in crystal plane orientation of the semiconductor layer and anisotropy in a channel length direction along which carriers flow. This is because effective mass of carriers has anisotropy in crystals.

For example, in the case of taking a semiconductor layer for an n-channel field-effect transistor from a semiconductor substrate with a {100} crystal plane orientation, it is preferable that a channel length direction be a <100> axis. If there are a plurality of <100> crystal axes in a semiconductor layer surface, any of the crystal axes can be set along a channel length direction.

On the other hand, in order to form a semiconductor layer for a p-channel field-effect transistor, it is preferable that a semiconductor substrate with a {110} crystal plane orientation be used and a channel length direction be parallel to a <110> axis. In such a manner, when a <100> axis is employed for an n-channel field-effect transistor and a <110> axis is employed for a p-channel field-effect transistor, mobility of electrons and holes flowing through a channel formation region can be further increased.

This embodiment can be implemented in combination with any of Embodiment Modes 1 to 4 as appropriate.

Embodiment Mode 6

This embodiment mode describes a structure in which a semiconductor layer suitable for an n-channel field-effect transistor and a semiconductor layer suitable for a p-channel field-effect transistor are taken out from a semiconductor substrate with a single crystal plane.

A case of using a semiconductor substrate with a {110} crystal plane orientation is described. In this case, the semiconductor layer of an n-channel field-effect transistor is formed to have a <100> axis as a channel length direction. On the other hand, the semiconductor layer of a p-channel field-effect transistor is formed to have a <110> axis as a channel length direction.

According to this embodiment mode, a first semiconductor layer in an n-channel field-effect transistor and a second semiconductor layer in a p-channel field-effect transistor can be taken out from a semiconductor substrate having a single crystal plane and provided over a supporting substrate, and a semiconductor integrated circuit or the like which includes different crystal axes in channel length directions can be obtained. When a <100> axis is employed for an n-channel field-effect transistor and a <110> axis is employed for a p-channel field-effect transistor, mobility of electrons and holes flowing through a channel formation region can be further increased.

Since a semiconductor layer of an n-channel field-effect transistor and a semiconductor layer of a p-channel field-effect transistor are independently bonded to a supporting substrate, design flexibility in a circuit configuration of the n-channel field-effect transistor and the p-channel field-effect transistor is ensured; accordingly, the integration density of the semiconductor integrated circuit or the like can be increased. Because a semiconductor device employing a semiconductor integrated circuit of the present invention has field-effect transistors with high mobility over a supporting substrate, high-speed operation, low-voltage driving, and lower power consumption can be achieved. Further, according to this embodiment mode, a structure for element isolation is not necessary; therefore, a manufacturing process can be simplified.

This embodiment can be implemented in combination with any of Embodiment Modes 1 to 4 as appropriate.

Embodiment Mode 7

This embodiment mode describes an example of a semiconductor device with high performance and high reliability. Specifically, as an example of the semiconductor device, examples of a microprocessor and a semiconductor device which has an arithmetic function and can transmit and receive data without contact are described.

Figure 9:
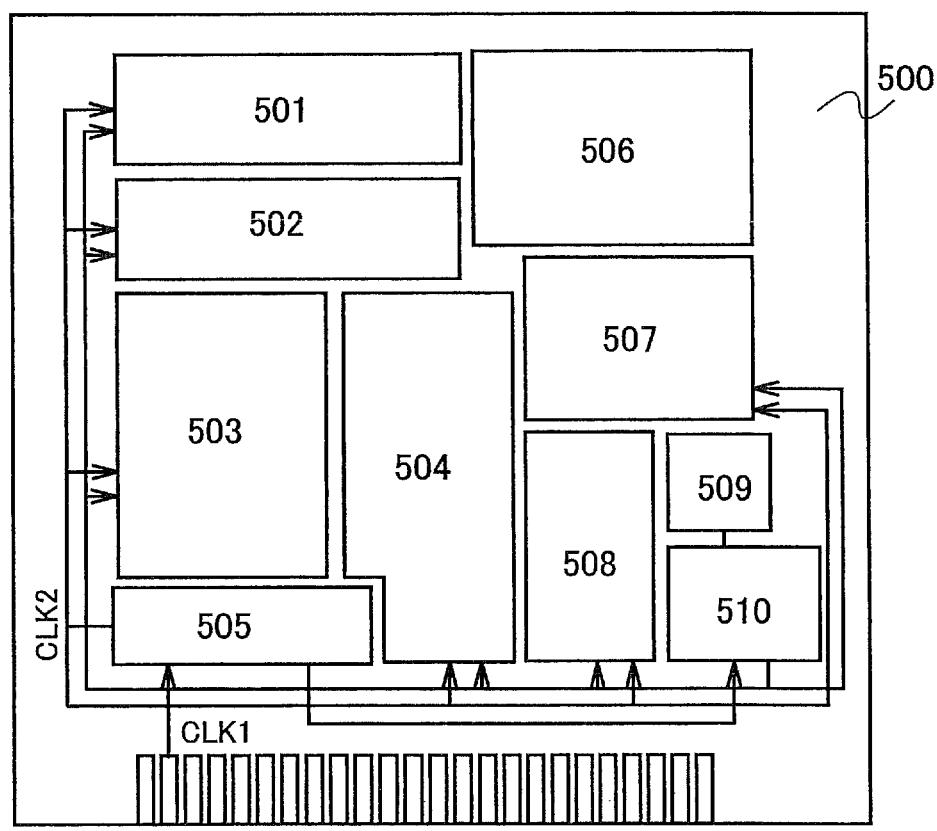
FIG. 9 is a block diagram illustrating a structure of a microprocessor which can be obtained employing a semiconductor device of the present invention.

FIG. 9 illustrates an example of a microprocessor 500 as an example of a semiconductor device. The microprocessor 500 is manufactured using the semiconductor substrate according to the above embodiment modes. This microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 via the bus interface 508 is input to the instruction decoder 503 and decoded, and then input to the ALU controller 502, the interrupt controller 504, the register controller 507, and the timing controller 505. The ALU controller 502, the interrupt controller 504, the register controller 507, and the timing controller 505 perform various control based on the decoded instruction. Specifically, the ALU controller 502 generates a signal for controlling operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads and writes data from and to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that FIG. 9 illustrates a mere example of the simplified structure of the microprocessor 500, and practical microprocessors can be provided with various structures depending on the usage.

Since the microprocessor 500 has an integrated circuit which employs semiconductor layers with a certain crystal orientation which are bonded to a glass substrate, lower power consumption can be achieved as well as higher processing speed.

Figure 10:
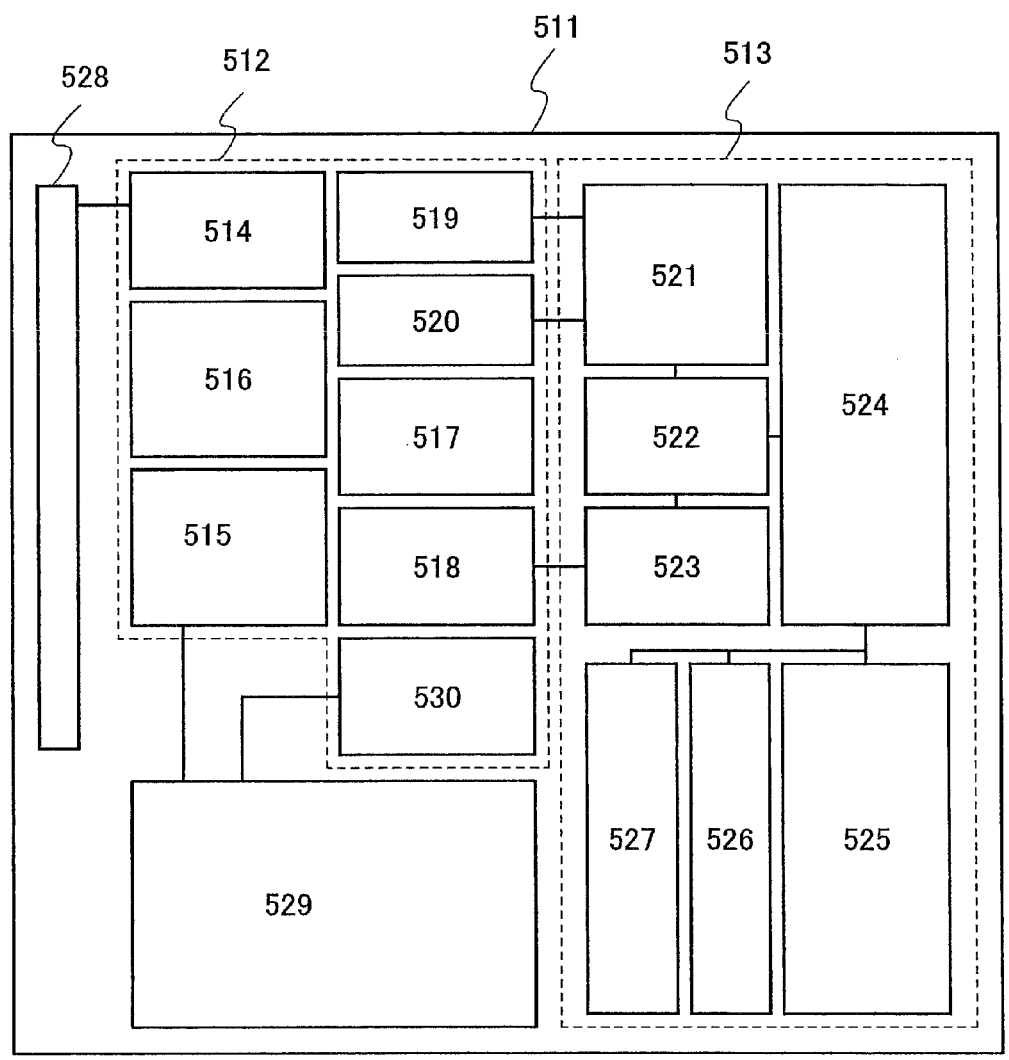
FIG. 10 is a block diagram illustrating a structure of an RFCPU which can be obtained employing a semiconductor device of the present invention.
Figure 11A:
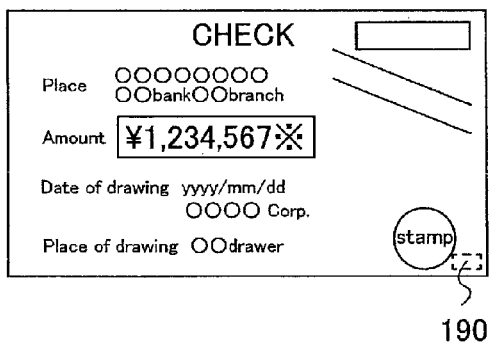
FIGS. 11A to 11G illustrate application examples of a semiconductor device of the present invention.
Figure 11B:
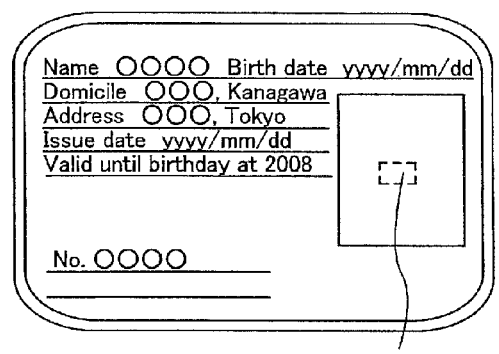
Figure 11C:
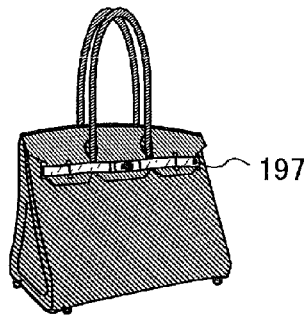
Figure 11D:
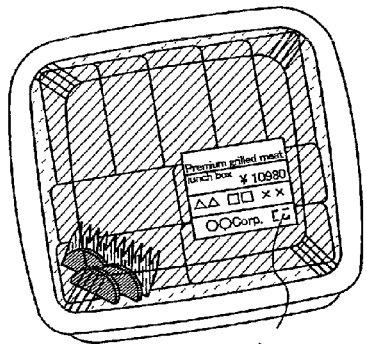
Figure 11E:
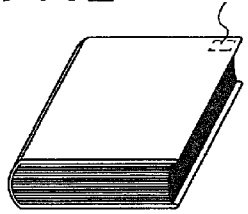
Figure 11F:
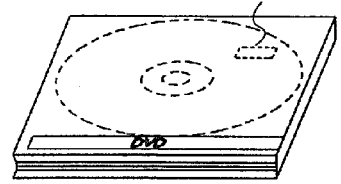
Figure 11G:
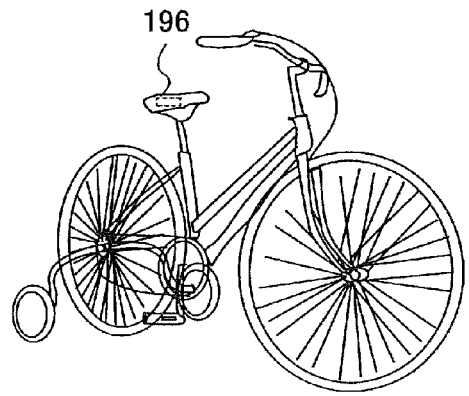

Next, an example of a semiconductor device provided with an arithmetic function by which data can be transmitted and received without contact is described with reference to FIG. 10. FIG. 10 illustrates an example of a computer which operates to transmit and receive signals to and from an external device by wireless communication (such a computer is hereinafter referred to as an "RFCPU"). An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is briefly described below. The resonance circuit 514 generates an induced electromotive force based on a signal received by an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated with the RFCPU 511 and may be attached as another component to a substrate having an insulating surface which is included in the RFCPU 511.

The reset circuit 517 generates a signal that resets and initializes the digital circuit portion 513. For example, the reset circuit 517 generates a signal that rises after increase in power supply voltage as a reset signal. The oscillator circuit 518 changes the frequency and the duty ratio of a clock signal depending on a control signal generated by the constant voltage circuit 516. The demodulation circuit 519 having a low pass filter, for example, binaries amplitude fluctuation of reception signals of an amplitude shift keying (ASK) system.

The modulation circuit 520 transmits transmission data by changing the amplitude of transmission signals of an amplitude shift keying (ASK) system. The modulation circuit 520 changes the amplitude of transmission signals of an amplitude shift keying (ASK) system to transmit the transmission signals. The modulation circuit 520 changes the resonance point of the resonance circuit 514, thereby changing the amplitude of communication signals. The clock controller 523 generates a control signal for changing the frequency and the duty ratio of the clock signal depending on the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the CPU interface 524. The CPU interface 524 has a function of generating an access signal for any of the read only memory 527, the random access memory 526, and the control register 522, based on an address requested by the central processing unit 525.

As an arithmetic method of the central processing unit 525, a method can be employed, in which the read only memory 527 stores an operating system (OS) and a program is read and executed at the time of starting operation. Note that a method can be employed, in which a circuit dedicated to arithmetic is formed and an arithmetic process is conducted using hardware. In a method in which both hardware and software are used, a method can be employed, in which part of process is conducted in the circuit dedicated to arithmetic and the other part of the arithmetic process is conducted by the central processing unit 525 using a program.

Since an integrated circuit is formed using semiconductor layers each of which has a certain crystal plane orientation and which are bonded to a glass substrate in the RFCPU 511, higher processing speed and lower power consumption can be achieved. Accordingly, even when the capacitor portion 529 which supplies electric power is downsized, operation for a long period of time can be ensured.

Embodiment Mode 8

This embodiment mode describes an example of a mounting structure of a semiconductor device according to the present invention.

An integrated circuit according to the present invention can be formed by highly integrating semiconductor elements in three dimensions. In such a highly integrated circuit, it is preferable to mount a heat sink that efficiently dissipates heat generated by the integrated circuit.

Figure 22A:
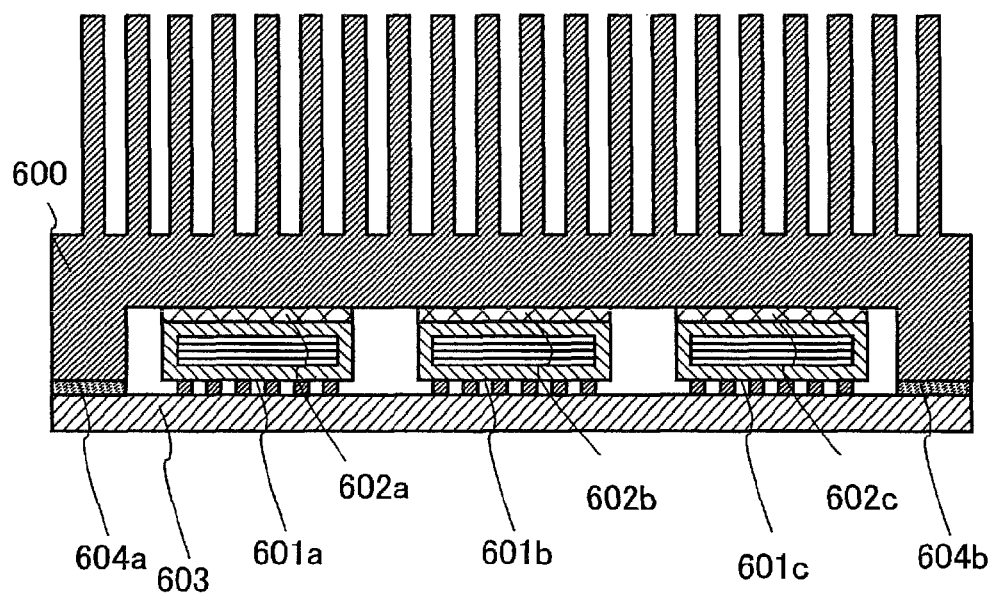
FIGS. 22A and 22B illustrate semiconductor devices of the present invention.

FIG. 22A illustrates a mode in which an integrated circuit is mounted on a printed circuit board as an example of a semiconductor device according to the present invention.

In FIG. 22A, integrated circuit packages 601a, 601b, and 601c in each of which an integrated circuit is packaged in an insulating chassis which are mounted on a printed circuit board 603 are provided in contact with a heat sink 600 via heat dissipation sheets 602a, 602b, and 602c which further improve a heat dissipation effect. The heat sink 600 is provided so as to cover the integrated circuit packages 601a, 601b, and 601c, and is electrically connected to the printed circuit board 603 via conductive metal layers 604a and 604b, and intercepts electromagnetic waves emitted from the integrated circuit packages 601a, 601b, and 601c. FIG. 22A illustrates a structure in which the heat sink which covers the integrated circuits can dissipate heat from the integrated circuits and can intercept electromagnetic waves to prevent electromagnetic interference.

Figure 22B:
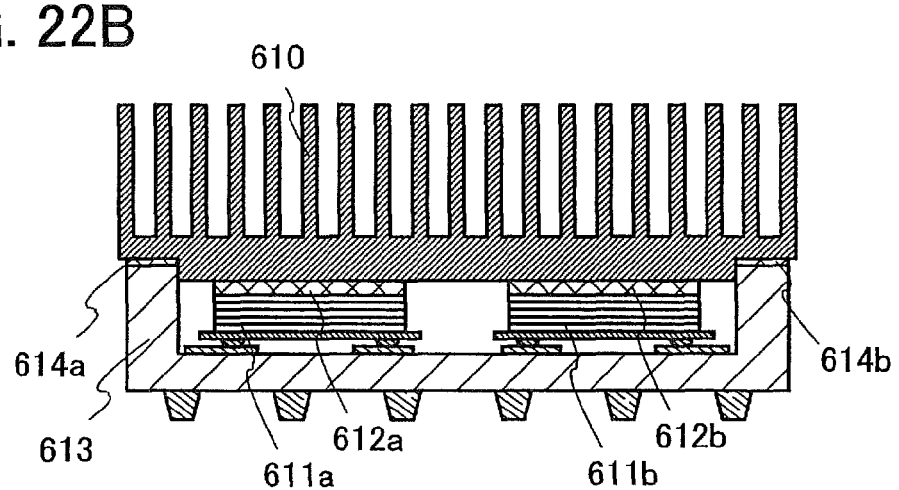

FIG. 22B illustrates an example in which a heat dissipation sheet and a heat sink are directly mounted on integrated circuits. In FIG. 22B, integrated circuits 611a and 611b are provided in contact with a heat sink 610 via heat dissipation sheets 612a and 612b, and are packaged by the heat sink 610 and a chassis 613 that adheres the heat sink 610 using adhesive layers 614a and 614b.

In this manner, when the heat sink is mounted, a semiconductor device with higher reliability and higher performance can be made by efficient heat dissipation and cooling.

This embodiment can be implemented in combination with any of the foregoing embodiment modes as appropriate.

Embodiment Mode 9

This embodiment mode describes an example of a usage mode of a semiconductor device described in the foregoing embodiment modes. Specifically, an application example of a semiconductor device capable of inputting and outputting data without contact is described with reference to the drawings. The semiconductor device to and from which data can be input and output without contact is also referred to as an RFID tag, an ID tag, an IC tag, an IC chip, an RF tag, a wireless tag, an electronic tag, or a wireless chip depending on the uses.

An example of a top view structure of a semiconductor device of this embodiment mode is described with reference to FIG. 12. A semiconductor device 2180 illustrated in FIG. 12 includes a thin film integrated circuit 2131 including a plurality of elements such as transistors for forming a memory portion and a logic portion, and a conductive layer 2132 which serves as an antenna. The conductive layer 2132 which serves as an antenna is electrically connected to the thin film integrated circuit 2131. The field-effect transistor according to the present invention which is described in Embodiment Modes 1 to 3 can be applied to the thin film integrated circuit 2131.

Figure 12:
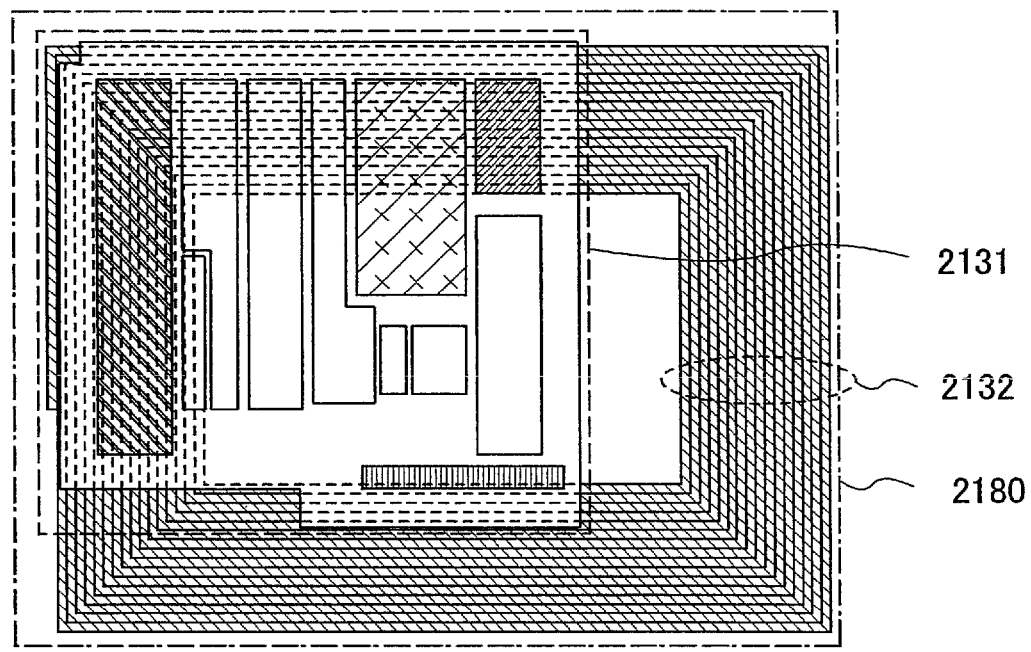
FIG. 12 illustrates a semiconductor device of the present invention.
Figure 13A:
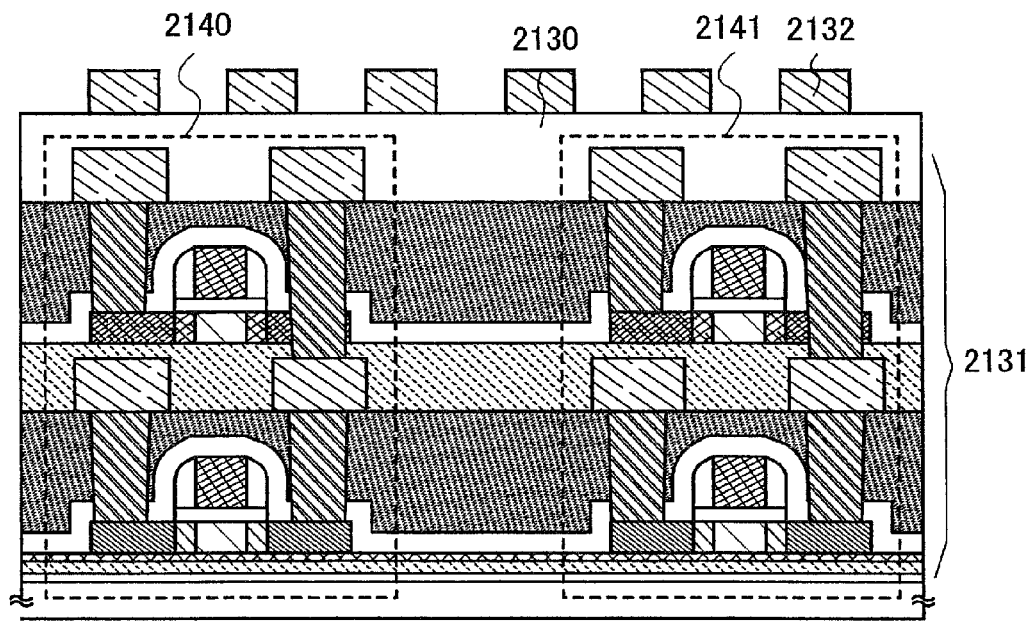
FIGS. 13A and 13B illustrate semiconductor devices of the present invention.
Figure 13B:
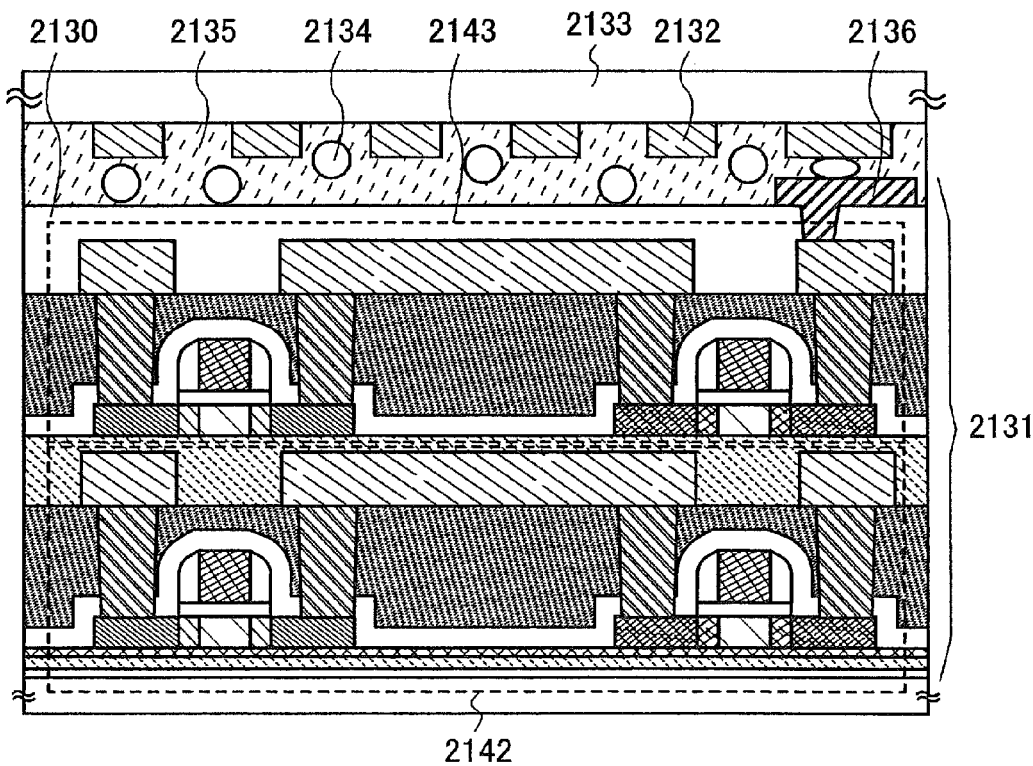

FIGS. 13A and 13B are schematic views of a cross section of FIG. 12. The conductive layer 2132 which serves as an antenna may be provided above the elements for forming the memory portion and the logic portion; for example, the conductive layer 2132 which serves as an antenna can be provided above CMOS structures 2140 and 2141 which can be manufactured as a field-effect transistor in the above embodiment modes, with an insulating layer 2130 interposed therebetween (see FIG. 13A). Alternatively, the conductive layer 2132 which serves as an antenna may be provided by providing the conductive layer 2132 over a substrate 2133 and then attaching the substrate 2133 and the thin film integrated circuit 2131 each other so as to sandwich the conductive layer 2132 (see FIG. 13B). FIG. 13B illustrates an example in which a conductive layer 2136 provided over the insulating layer 2130 and the conductive layer 2132 which serves as an antenna are electrically connected to each other with conducting particles 2134 contained in an adhesive resin 2135.

Since a semiconductor device of the present invention has a structure in which semiconductor elements are stacked three dimensionally and are highly integrated, the semiconductor elements can be aligned side by side and in contact with one insulating layer or they can be stacked above and below with a planarization layer interposed therebetween and be in contact with different insulating layers. Therefore, arrangement flexibility of semiconductor elements in the semiconductor device is increased, which can lead to further integration and higher performance. As a semiconductor element, not to mention a field-effect transistor, a memory element which uses a semiconductor layer can be employed; accordingly, a semiconductor device which can satisfy functions required for various applications can be manufactured and provided.

Transistors included in the CMOS structures 2140, 2141, 2142, and 2143 have a sidewall insulating layer having a sidewall structure and include low concentration impurity regions between a channel formation region and a source region and a drain region, which are high concentration impurity regions, in a semiconductor layer. As an example, the CMOS structures 2140 and 2141 are formed of a field-effect transistor in the lower layer and a field-effect transistor in the upper layer which are stacked, while the CMOS structures 2142 and 2143 are formed of field-effect transistors that are in contact with one insulating layer and arranged in series, and the CMOS structure 2142 and the CMOS structure 2143 are stacked.

Note that although this embodiment mode describes an example in which the conductive layer 2132 which serves as an antenna has a coil shape and either an electromagnetic induction method or an electromagnetic coupling method is employed, a semiconductor device of the present invention is not limited thereto, and a microwave method may be employed. In the case of a microwave method, the shape of the conductive layer 2132 which serves as an antenna may be decided as appropriate depending on the wavelength of an electromagnetic wave which is used.

For example, when a microwave method (e.g., with an UHF band (in the range of 860 MHz to 960 MHz), a frequency band of 2.45 GHz, or the like) is employed as a signal transmission method of the semiconductor device 2180, the shape such as the length of the conductive layer which serves as an antenna may be set as appropriate in consideration of the wavelength of an electromagnetic wave which is used in transmitting a signal. For example, the conductive layer which serves as an antenna can be formed into a linear shape (e.g., a dipole antenna) or a flat shape (e.g., a patch antenna or an antenna having a ribbon shape). Further, the shape of the conductive layer 2132 that serves as an antenna is not limited to a straight line, the conductive layer 2132 may be a curved line, in an S-shape, or in a shape combining them may be provided in consideration of the wavelength of the electromagnetic wave.

The conductive layer 2132 which serves as an antenna is formed of a conductive material by a CVD method, a sputtering method, a printing method such as screen printing or gravure printing, a droplet discharge method, a dispenser method, a plating method, or the like. The conductive material is any of a metal element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing any of those element. The conductive layer 2132 has a single layer structure or a stacked-layer structure.

For example, in the case where the conductive layer 2132 which serves as an antenna is formed by a screen printing method, the conductive layer 2132 can be provided by selectively printing a conductive paste in which conductive particles with a grain diameter of several nanometers to several tens of micrometers are dissolved or dispersed in an organic resin. As the conductive particle, fine particles or dispersive nanoparticles of one or more metals of silver (Ag), gold (Au), copper (Cu), nickel (Ni), platinum (Pt), palladium (Pd), tantalum (Ta), molybdenum (Mo), titanium (Ti), or a silver halide can be used. In addition, as the organic resin contained in the conductive paste, one or a plurality of organic resins serving as a binder, a solvent, a dispersant, or a coating of the metal particle can be used. Typically, an organic resin such as an epoxy resin and a silicone resin can be given as examples. Further, in forming the conductive layer, baking may be preferably performed after the conductive paste is applied. For example, in the case of using fine particles (e.g., fine particles with a grain diameter of 1 nm or more and 100 nm or less) containing silver as a main component of the conductive paste, the conductive layer can be formed by baking the conductive paste at a temperature in the range of 150 to 300° C. to be hardened. Alternatively, fine particles containing solder or lead-free solder as its main component may be used. In that case, fine particles having a grain size of 20 μm or less are preferably used. Solder or lead-free solder has advantages such as low cost.

Lower power consumption can be achieved in a semiconductor device to which the present invention is applied. Therefore, the present invention is effective in a small semiconductor device capable of inputting and outputting data without contact.

Embodiment Mode 10

This embodiment mode describes an example of application of the above-described semiconductor device capable of inputting and outputting data without contact, which is formed according to the present invention, with reference to the drawings. The semiconductor device to and from which data can be input and output without contact is also referred to as an RFID tag, an ID tag, an IC tag, an IC chip, an RF tag, a wireless tag, an electronic tag, or a wireless chip depending on the uses.

Figure 14A:
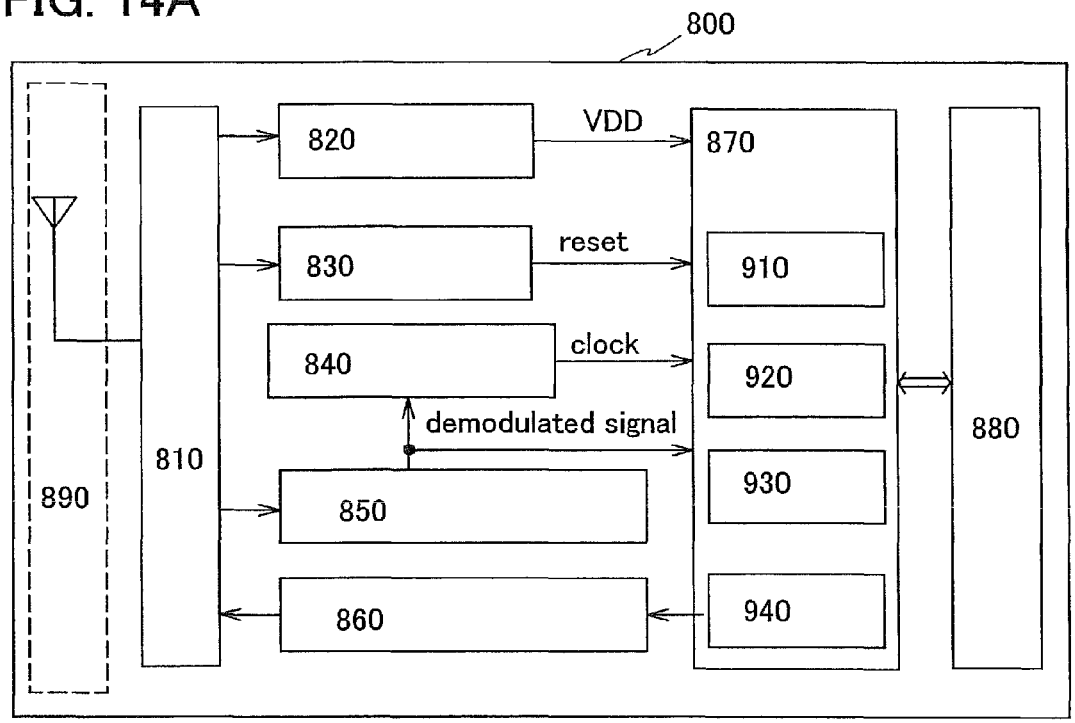
FIGS. 14A to 14C illustrate application examples of a semiconductor device of the present invention.

A semiconductor device 800 has a function of communicating data without contact, and includes a high frequency circuit 810, a power supply circuit 820, a reset circuit 830, a clock generation circuit 840, a data demodulation circuit 850, a data modulation circuit 860, a control circuit 870 which controls another circuit, a memory circuit 880, and an antenna 890 (see FIG. 14A). The high frequency circuit 810 receives a signal by the antenna 890 and also outputs a signal from the antenna 890 which is received by the data modulating circuit 860. The power supply circuit 820 generates a power source potential from a received signal. The reset circuit 830 generates a reset signal. The clock generation circuit 840 generates various clock signals based on a received signal input from the antenna 890. The data demodulation circuit 850 demodulates and outputs a received signal to the control circuit 870. The data demodulation circuit 850 demodulates and outputs a received signal to the control circuit 870. In the control circuit 870, a code extraction circuit 910, a code judgment circuit 920, a CRC judgment circuit 930, and an output unit circuit 940 are included, for example. Note that the code extraction circuit 910 extracts a plurality of codes included in instructions transmitted to the control circuit 870. The code judgment circuit 920 compares the extracted codes and codes corresponding to a reference to judge the content of the instructions. The CRC judgment circuit 930 detects the presence of transmission errors and the like based on the judged codes.

Next, an example of operation of the above-described semiconductor device is described. First, a radio signal is received by the antenna 890. The radio signal is transmitted to the power supply circuit 820 via the high frequency circuit 810, and a high power supply potential (hereinafter referred to as VDD) is generated. The VDD is supplied to each circuit included in the semiconductor device 800. A signal transmitted to the data demodulation circuit 850 via the high frequency circuit 810 is demodulated (hereinafter, such a signal is referred to as a demodulated signal). Further, the demodulated signal and a signal which has passed the high frequency circuit 810 and the reset circuit 830 or the clock generation circuit 840 are transmitted to the control circuit 870. The signal transmitted to the control circuit 870 is analyzed by the code extraction circuit 910, the code judgment circuit 920, the CRC judgment circuit 930, and the like. Then, based on the analyzed signal, information of the semiconductor device which is stored in the memory circuit 880 is output. The output information of the semiconductor device is encoded by passing through the output unit circuit 940. Furthermore, the encoded information of the semiconductor device 800 passes through the data modulation circuit 860 and transmitted by the antenna 890 as a radio signal. Note that among a plurality of circuits included in the semiconductor device 800, a low power supply potential (hereinafter, referred to as VSS) is common and VSS can be set as GND.

In this manner, data in the semiconductor device 800 can be read by transmitting a signal to the semiconductor device 800 from a communication device and by receiving a signal which is transmitted from the semiconductor device 800 by the communication device.

The semiconductor device 800 may be a type in which, for supply of a power supply voltage to each circuit, no electric power supply (battery) is installed and a power supply voltage is supplied by use of electromagnetic waves; or the semiconductor device 800 may be a type in which, for supply of a power supply voltage to each circuit, an electric power supply (battery) is installed and a power supply voltage is supplied to each circuit by use of electromagnetic waves and a battery.

Figure 14B:
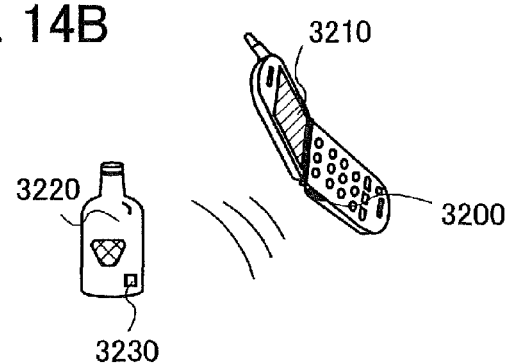
Figure 14C:
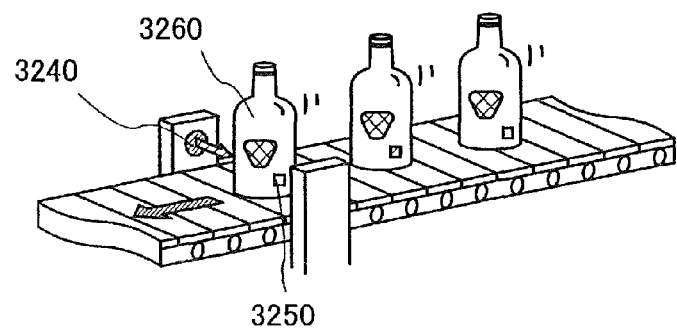

Next, an example of a usage mode of a semiconductor device capable of inputting and outputting data without contact is described. A communication device 3200 is provided on a side surface of a portable terminal including a display portion 3210, and a semiconductor device 3230 is provided on a side surface of an article 3220 (see FIG. 14B). When the communication device 3200 is put close to the semiconductor device 3230 on the article 3220, information of the article 3220, such as its raw material, its place of production, inspection results for each production step, the history of distribution, or an description of the article, is displayed on the display portion 3210. Further, while a product 3260 is transported by a conveyor belt, the product 3260 can be inspected using a communication device 3240 and a semiconductor device 3250 provided on the product 3260 (see FIG. 14C). Thus, by application of a semiconductor device to a system, information can be acquired easily, and high function and high added value can be realized. Further, since the semiconductor device according to the present invention can realize lower power consumption and higher integration, a semiconductor device provided for an article can be downsized.

A semiconductor device according to the present invention has a very wide range of application and can be used in electronic devices in various fields.

Embodiment Mode 11

According to the present invention, a semiconductor device serving as a chip having a processor circuit (hereinafter also referred to as a processor chip, a wireless chip, a wireless processor, a wireless memory, a wireless tag, or an RFID tag) can be formed. An applicable range of a semiconductor device according to the present invention is wide, and the semiconductor device can be applied to any product as long as it clarifies information of an object, such as the history thereof, without contact and is useful for production, management, and the like. For example, the semiconductor device can be mounted on bills, coins, securities, certificates, bearer bonds, packing containers, books, recording media, personal belongings, vehicles, food, clothing, health products, livingwares, medicine, electronic appliances, and the like. Examples of them are described with reference to FIGS. 11A to 11G.

Bills and coins are money circulating in the market, and include one valid in a certain area (cash voucher), memorial coins, and the like. Securities refer to checks, certificates, promissory notes, and the like and can be provided with a chip 190 having a processor circuit (see FIG. 11A). Certificates refer to driver's licenses, certificates of residence, and the like and can be provided with a chip 191 having a processor circuit (see FIG. 11B). Personal belongings refer to bags, glasses, and the like and can be provided with a chip 197 having a processor circuit (see FIG. 11C). Bearer bonds refer to stamps, rice coupons, various gift certificates, and the like. Packing containers refer to wrapping paper for food containers, plastic bottles, and the like and can be provided with a chip 193 having a processor circuit (see FIG. 11D). Books refer to hardbacks, paperbacks, and the like and can be provided with a chip 194 having a processor circuit (see FIG. 11E). Recording media refer to DVD software, video tapes, and the like and can be provided with a chip 195 having a processor circuit (see FIG. 11F). Vehicles refer to wheeled vehicles like bicycles, ships, and the like and can be provided with a chip 196 having a processor circuit (see FIG. 11G). Food products refer to food items, beverages, and the like. Clothing refers to clothes, footwear, and the like. Health products refer to medical instruments, health instruments, and the like. Livingwares refer to furniture, lighting equipment, and the like. Medicine refers to medical products, pesticides, and the like. Electronic devices refer to liquid crystal display devices, EL display devices, television sets (TV receivers and flat-screen TV receivers), cellular phones, and the like.

The semiconductor device can be provided by being attached to the surface of goods or being embedded in goods. For example, in the case of a book, the semiconductor device may be embedded in a piece of paper; and in the case of a package made from an organic resin, the semiconductor device may be embedded in the organic resin.

In this manner, when the semiconductor device is provided for packaging containers, recording media, personal belongings, foods, clothing, livingwares, electronic devices, and the like, the efficiency of an inspection system, a rental shop system, and the like can be improved. In addition, when the semiconductor device is provided for vehicles, forgery and theft thereof can be prevented. Further, when the semiconductor device is implanted in creatures such as animals, identification of an individual creature can be easily carried out. For example, when the semiconductor device provided with a sensor is implanted in creatures such as livestocks, its health condition such as a current body temperature as well as its birth year, sex, breed, or the like can be easily managed.

Note that this embodiment can be implemented in combination with any of Embodiment Modes 1 to 10 as appropriate.

This application is based on Japanese Patent Application serial no. 2007-218478 filed with Japan Patent Office on Aug. 24, 2007, the entire contents of which are hereby incorporated by reference.

What is claimed is:

1. A method for manufacturing a semiconductor device, comprising the steps of:
    forming a first fragile layer in a first single-crystalline semiconductor substrate by ion irradiation;
    bonding the first single-crystalline semiconductor substrate over an insulating substrate;
    separating the first single-crystalline semiconductor substrate at the first fragile layer so that a first single-crystalline semiconductor layer is formed over the insulating substrate;
    forming a first field-effect transistor using the first single-crystalline semiconductor layer;
    forming a planarization layer over the first field-effect transistor;
    forming a second fragile layer in a second single-crystalline semiconductor substrate by ion irradiation;
    bonding the second single-crystalline semiconductor substrate over the planarization layer;
    separating the second single-crystalline semiconductor substrate at the second fragile layer so that a second single-crystalline semiconductor layer is formed over the planarization layer; and
    forming a second field-effect transistor using the second single-crystalline semiconductor layer,
    wherein the first single-crystalline semiconductor layer and the second single-crystalline semiconductor layer are not overlapped with each other.

2. The method for manufacturing a semiconductor device according to claim 1, wherein a conductivity type of the first field-effect transistor is an n-type and a conductivity type of the second field-effect transistor is a p-type.

3. The method for manufacturing a semiconductor device according to claim 1, wherein a crystal plane orientation of a plane of the first single-crystalline semiconductor layer is a {100} plane and a crystal plane orientation of a plane of the second single-crystalline semiconductor layer is a {110} plane.

4. The method for manufacturing a semiconductor device according to claim 3, wherein a crystal axis of a channel length direction of the first single-crystalline semiconductor layer is <100> and a crystal axis of a channel length direction of the second single-crystalline semiconductor layer is <110>.

5. The method for manufacturing a semiconductor device according to claim 1,
    wherein the first single-crystalline semiconductor layer and the second single-crystalline semiconductor layer are overlapped with each other with the planarization layer interposed therebetween, and
    wherein the first field-effect transistor and the second field-effect transistor are electrically connected to each other by a wiring which is formed in an opening which penetrates the second single-crystalline semiconductor layer and the planarization layer, and reaches the first single-crystalline semiconductor layer.

6. The method for manufacturing a semiconductor device according to claim 1, wherein the insulating substrate is a glass substrate.

7. The method for manufacturing a semiconductor device according to claim 1,
    wherein the first field-effect transistor and the second field-effect transistor are electrically connected to each other.

8. A method for manufacturing a semiconductor device, comprising the steps of:
    forming a first fragile layer in a first single-crystalline semiconductor substrate by ion irradiation;
    forming a groove in the first single-crystalline semiconductor substrate by selectively etching the first single-crystalline semiconductor substrate;
    bonding the first single-crystalline semiconductor substrate over an insulating substrate;
    separating the first single-crystalline semiconductor substrate at the first fragile layer so that a first single-crystalline semiconductor island is formed over the insulating substrate;
    forming a first field-effect transistor using the first single-crystalline semiconductor island;
    forming a planarization layer over the first field-effect transistor;
    forming a second fragile layer in a second single-crystalline semiconductor substrate by ion irradiation;
    forming a groove in the second single-crystalline semiconductor substrate by selectively etching the second single-crystalline semiconductor substrate;
    bonding the second single-crystalline semiconductor substrate over the planarization layer;
    separating the second single-crystalline semiconductor substrate at the second fragile layer so that a second single-crystalline semiconductor island is formed over the planarization layer; and
    forming a second field-effect transistor using the second single-crystalline semiconductor island.

9. The method for manufacturing a semiconductor device according to claim 8, wherein a conductivity type of the first field-effect transistor is an n-type and a conductivity type of the second field-effect transistor is a p-type.

10. The method for manufacturing a semiconductor device according to claim 8, wherein a crystal plane orientation of a plane of the first single-crystalline semiconductor island is a {100} plane and a crystal plane orientation of a plane of the second single-crystalline semiconductor island is a {110} plane.

11. The method for manufacturing a semiconductor device according to claim 10, wherein a crystal axis of a channel length direction of the first single-crystalline semiconductor island is <100> and a crystal axis of a channel length direction of the second single-crystalline semiconductor island is <110>.

12. The method for manufacturing a semiconductor device according to claim 8,
    wherein the first single-crystalline semiconductor island and the second single-crystalline semiconductor island are overlapped with each other with the planarization layer interposed therebetween, and
    wherein the first field-effect transistor and the second field-effect transistor are electrically connected to each other by a wiring which is formed in an opening which penetrates the second single-crystalline semiconductor island and the planarization layer, and reaches the first single-crystalline semiconductor island.

13. The method for manufacturing a semiconductor device according to claim 8, wherein the insulating substrate is a glass substrate.

14. The method for manufacturing a semiconductor device according to claim 8,
    wherein the first single-crystalline semiconductor island and the second single-crystalline semiconductor island are not overlapped with each other, and wherein the first field-effect transistor and the second field-effect transistor are electrically connected to each other.

15. A method for manufacturing a semiconductor device, comprising the steps of:
forming a first fragile layer in a first single-crystalline semiconductor substrate by ion irradiation;
bonding the first single-crystalline semiconductor substrate over an insulating substrate;
separating the first single-crystalline semiconductor substrate at the first fragile layer so that a first single-crystalline semiconductor layer is formed over the insulating substrate;
forming a first field-effect transistor using the first single-crystalline semiconductor layer;
forming a planarization layer over the first field-effect transistor;
forming a second fragile layer in a second single-crystalline semiconductor substrate by ion irradiation;
bonding the second single-crystalline semiconductor substrate over the planarization layer;
separating the second single-crystalline semiconductor substrate at the second fragile layer so that a second single-crystalline semiconductor layer is formed over the planarization layer; and
forming a second field-effect transistor using the second single-crystalline semiconductor layer,
wherein the step of forming the first field-effect transistor comprises a step of adding an impurity element imparting n-type conductivity to form n-type impurity regions in the first single-crystalline semiconductor layer, and
wherein the step of forming the second field-effect transistor comprises a step of adding an impurity element imparting p-type conductivity to form p-type impurity regions in the first single-crystalline semiconductor layer.

16. The method for manufacturing a semiconductor device according to claim 15, wherein a conductivity type of the first field-effect transistor is an n-type and a conductivity type of the second field-effect transistor is a p-type.

17. The method for manufacturing a semiconductor device according to claim 15, wherein a crystal plane orientation of a plane of the first single-crystalline semiconductor layer is a {100} plane and a crystal plane orientation of a plane of the second single-crystalline semiconductor layer is a {110} plane.

18. The method for manufacturing a semiconductor device according to claim 17, wherein a crystal axis of a channel length direction of the first single-crystalline semiconductor layer is <100> and a crystal axis of a channel length direction of the second single-crystalline semiconductor layer is <110>.

19. The method for manufacturing a semiconductor device according to claim 15,
wherein the first single-crystalline semiconductor layer and the second single-crystalline semiconductor layer are overlapped with each other with the planarization layer interposed therebetween, and
wherein the first field-effect transistor and the second field-effect transistor are electrically connected to each other by a wiring which is formed in an opening which penetrates the second single-crystalline semiconductor layer and the planarization layer, and reaches the first single-crystalline semiconductor layer.

20. The method for manufacturing a semiconductor device according to claim 15, wherein the insulating substrate is a glass substrate.

21. The method for manufacturing a semiconductor device according to claim 15,
wherein the first single-crystalline semiconductor layer and the second single-crystalline semiconductor layer are not overlapped with each other, and
wherein the first field-effect transistor and the second field-effect transistor are electrically connected to each other.

* * * * *